US010332997B2

(12) United States Patent
Sato et al.

(10) Patent No.: US 10,332,997 B2
(45) Date of Patent: Jun. 25, 2019

(54) SEMICONDUCTOR DEVICE AND METHOD OF MANUFACTURING SEMICONDUCTOR DEVICE

(71) Applicant: HITACHI, LTD., Chiyoda-ku, Tokyo (JP)

(72) Inventors: Shintaroh Sato, Tokyo (JP); Masahiro Masunaga, Tokyo (JP); Akio Shima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/167,982

(22) Filed: Oct. 23, 2018

(65) Prior Publication Data

US 2019/0148546 A1 May 16, 2019

(30) Foreign Application Priority Data

Nov. 10, 2017 (JP) ................................. 2017-216912

(51) Int. Cl.
*H01L 21/04* (2006.01)
*H01L 29/08* (2006.01)
(Continued)

(52) U.S. Cl.
CPC ...... *H01L 29/7834* (2013.01); *H01L 21/0465* (2013.01); *H01L 21/0475* (2013.01);
(Continued)

(58) Field of Classification Search
CPC ............. H01L 29/7834; H01L 29/0847; H01L 29/1608; H01L 29/517; H01L 29/66068;
(Continued)

(56) References Cited

U.S. PATENT DOCUMENTS

| 5,306,655 | A | * | 4/1994 | Kurimoto | ......... H01L 21/28114 |
| | | | | | 257/E21.205 |
| 5,498,556 | A | * | 3/1996 | Hong | ................ H01L 21/26586 |
| | | | | | 257/344 |
| 5,554,544 | A | * | 9/1996 | Hsu | ................... H01L 21/26586 |
| | | | | | 257/344 |
| 5,920,774 | A | * | 7/1999 | Wu | ................. H01L 21/823418 |
| | | | | | 257/E21.619 |

(Continued)

FOREIGN PATENT DOCUMENTS

JP 2013-093482 A 5/2013

*Primary Examiner* — Victor A Mandala
(74) *Attorney, Agent, or Firm* — Miles & Stockbridge P.C.

(57) ABSTRACT

There is provided a semiconductor device that improves reliability. The impurity concentrations of a $p^{++}$ source region and a $p^{++}$ drain region are $5\times10^{20}$ cm$^{-3}$ or more. The channel-region-side end portion of a first insulating film is disposed on a $p^{+}$ source region. The end portion has an inclined surface where the first insulating film thickness is reduced from the $p^{+}$ source region toward a channel region. The channel-region-side end portion of a second insulating film is disposed on a $p^{+}$ drain region. The end portion has an inclined surface where the second insulating film thickness is reduced from the $p^{+}$ drain region toward the channel region. A gate electrode is disposed on the channel region, the $p^{+}$ source region, the $p^{+}$ drain region, and the inclined surfaces of the first and the second insulating films through a gate insulating film including an aluminum oxide film.

15 Claims, 24 Drawing Sheets

(51) Int. Cl.

| | | |
|---|---|---|
| | *H01L 29/10* | (2006.01) |
| | *H01L 29/16* | (2006.01) |
| | *H01L 29/51* | (2006.01) |
| | *H01L 29/66* | (2006.01) |
| | *H01L 29/78* | (2006.01) |
| | *H01L 21/311* | (2006.01) |
| | *H01L 27/092* | (2006.01) |
| | *H01L 29/423* | (2006.01) |

(52) U.S. Cl.
 CPC ...... *H01L 21/31116* (2013.01); *H01L 27/092* (2013.01); *H01L 29/0847* (2013.01); *H01L 29/1033* (2013.01); *H01L 29/1608* (2013.01); *H01L 29/42356* (2013.01); *H01L 29/517* (2013.01); *H01L 29/6659* (2013.01); *H01L 29/66068* (2013.01)

(58) Field of Classification Search
 CPC ........... H01L 29/1033; H01L 21/31116; H01L 21/29; H01L 21/6659; H01L 29/42356; H01L 27/092; H01L 21/0465; H01L 21/0475
 See application file for complete search history.

(56) References Cited

U.S. PATENT DOCUMENTS

| | | | | |
|---|---|---|---|---|
| 6,136,674 | A * | 10/2000 | An | H01L 21/26506 438/585 |
| 6,169,306 | B1 * | 1/2001 | Gardner | H01L 21/28167 257/310 |
| 6,352,885 | B1 * | 3/2002 | Wieczorek | H01L 29/42368 257/E21.345 |
| 6,455,383 | B1 * | 9/2002 | Wu | H01L 21/28061 257/E21.2 |
| 7,161,203 | B2 * | 1/2007 | Basceri | H01L 21/28194 257/296 |
| 2005/0017319 | A1 * | 1/2005 | Manabe | H01L 21/28185 257/498 |
| 2008/0067589 | A1 * | 3/2008 | Ito | H01L 29/66575 257/344 |
| 2011/0147854 | A1 * | 6/2011 | Nandakumar | H01L 21/26506 257/382 |
| 2013/0200470 | A1 * | 8/2013 | Liu | H01L 29/66795 257/408 |
| 2014/0273376 | A1 * | 9/2014 | Kalnitsky | H01L 21/823418 438/275 |
| 2017/0194490 | A1 * | 7/2017 | Li | H01L 21/76897 |

* cited by examiner

SEMICONDUCTOR DEVICE AND METHOD OF MANUFACTURING SEMICONDUCTOR DEVICE

BACKGROUND

The present invention relates to a semiconductor device and a method of manufacturing a semiconductor device.

Silicon carbide (SiC) has a band gap approximately three times greater than the band gap of silicon (Si). Thus, since the thermal excitation of minority carriers rarely takes place in SiC, semiconductor devices using SiC can operate at a high temperature of 300° C. or more. Therefore, the semiconductor devices using SiC are expected to be usable as sensors, for example, in high temperature environments.

Japanese Unexamined Patent Application Publication No. 2013-93482 discloses that in a SiC substrate, for example, regions having high and low concentrations of impurities are provided below a gate insulating layer with a channel region sandwiched.

SUMMARY

The present inventors investigate the appropriately setting of a threshold voltage in a SiC metal-oxide-semiconductor field-effect transistor (MOSFET). The improvement of reliability of semiconductor devices including a SiC-MOSFET is desired by devising these semiconductor devices and a method of manufacturing the semiconductor devices.

Other objects and novel features will be apparent from the description of the present specification and the accompanying drawings.

A semiconductor device according to an embodiment includes an $n^+$ SiC substrate, an $n^-$ epitaxial layer formed on the principal surface of the $n^+$ SiC substrate, and a $p^{++}$ source region and a $p^{++}$ drain region formed apart from each other in the $n^-$ epitaxial layer. The semiconductor device includes a $p^+$ low concentration source region formed in $n^-$ epitaxial layer adjacent to the $p^{++}$ source region on the $p^{++}$ drain region side, and a $p^+$ low concentration drain region formed in $n^-$ epitaxial layer adjacent to the $p^{++}$ drain region on the $p^{++}$ source region side. The semiconductor device includes a channel region formed at the surface layer portion of the $n^-$ epitaxial layer between the end side surface of the $p^+$ low concentration source region and the end side surface of the $p^+$ low concentration drain region. The semiconductor device includes a first insulating film formed on the $p^{++}$ source region and the $p^+$ low concentration source region and a second insulating film formed on the $p^{++}$ drain region and the $p^+$ low concentration drain region. The semiconductor device includes a gate insulating film formed on the channel region, the $p^+$ low concentration source region, the $p^+$ low concentration drain region, the first insulating film, and the second insulating film, and a gate electrode formed on the gate insulating film. The gate insulating film includes an aluminum oxide film. The impurity concentrations of the $p^{++}$ source region and the $p^{++}$ drain region are $5 \times 10^{20}$ cm$^{-3}$ or more. The end portion of the first insulating film on the channel region side is disposed on the $p^+$ low concentration source region. The end portion has a first inclined surface where the thickness of the first insulating film is reduced along the direction from the $p^+$ low concentration source region to the channel region. The end portion of the second insulating film on the channel region side is disposed on the $p^+$ low concentration drain region. The end portion has a second inclined surface where the thickness of the second insulating film is reduced along the direction from the $p^+$ low concentration drain region to the channel region. The gate electrode is disposed, through the gate insulating film, on the channel region, the $p^+$ low concentration source region, the $p^+$ low concentration drain region, the first inclined surface of the first insulating film, and the second inclined surface of the second insulating film.

According to the embodiment, the improvement of reliability of semiconductor devices is enabled.

DETAILED DESCRIPTION

In the following, embodiments of the present invention will be described in detail with reference to the drawings. Note that in all the drawings for explaining the embodiments, members having the same functions are designated with the same reference signs, and the redundant description is omitted. In the embodiments below, the same or similar description is not repeated in principle unless otherwise necessary.

Note that the symbols "−" and "+" express relative concentrations of n conductivity type or p conductivity type impurities. In the n-type impurity, for example, the impurity concentration is increased in order of "n−−", "n−", "n", "n+", and "n++".

First Embodiment

Structure of a Semiconductor Device

Figure 1:
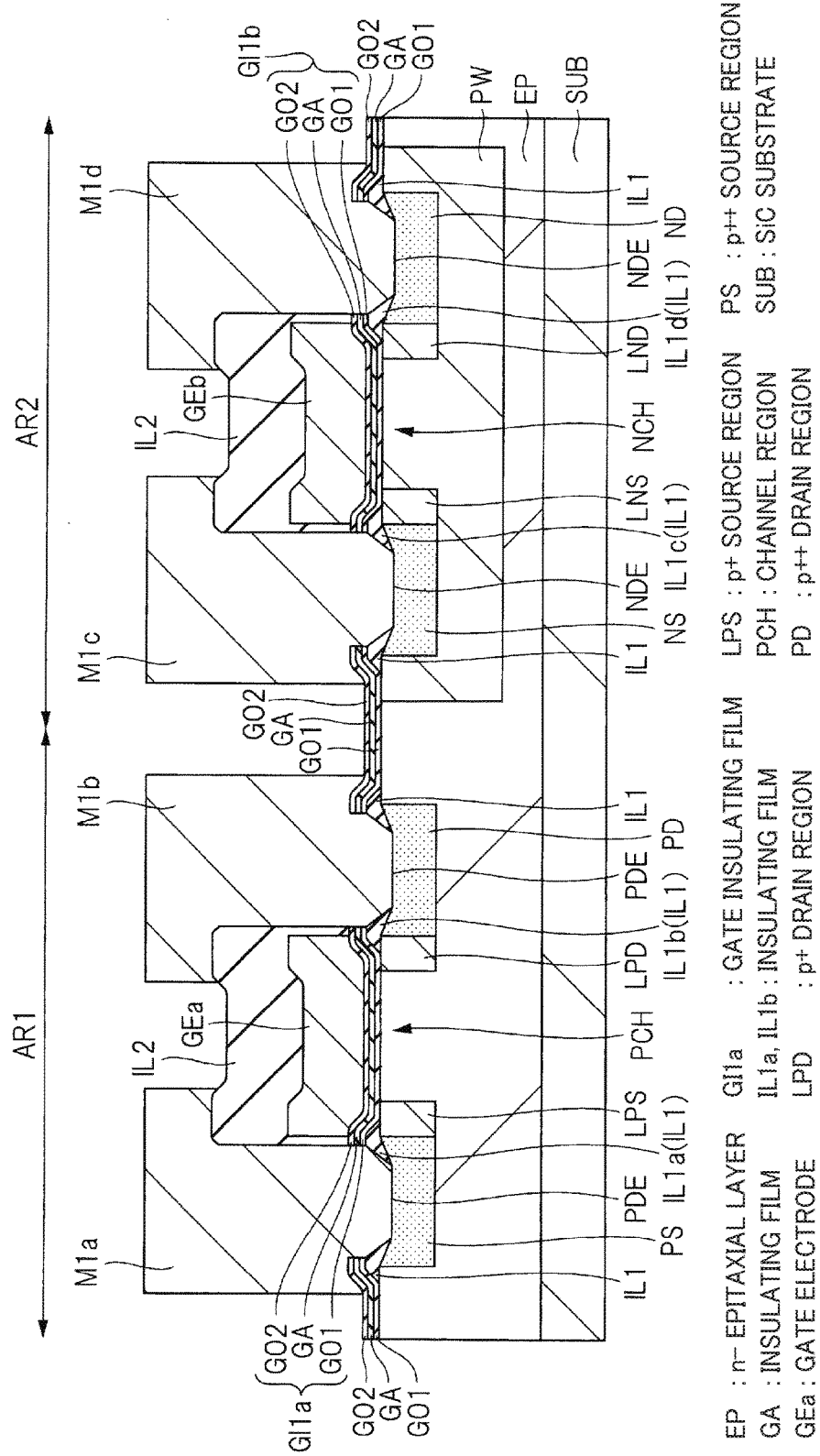
FIG. 1 is a cross sectional view of the main components of a semiconductor device according to an embodiment.
Figure 2:
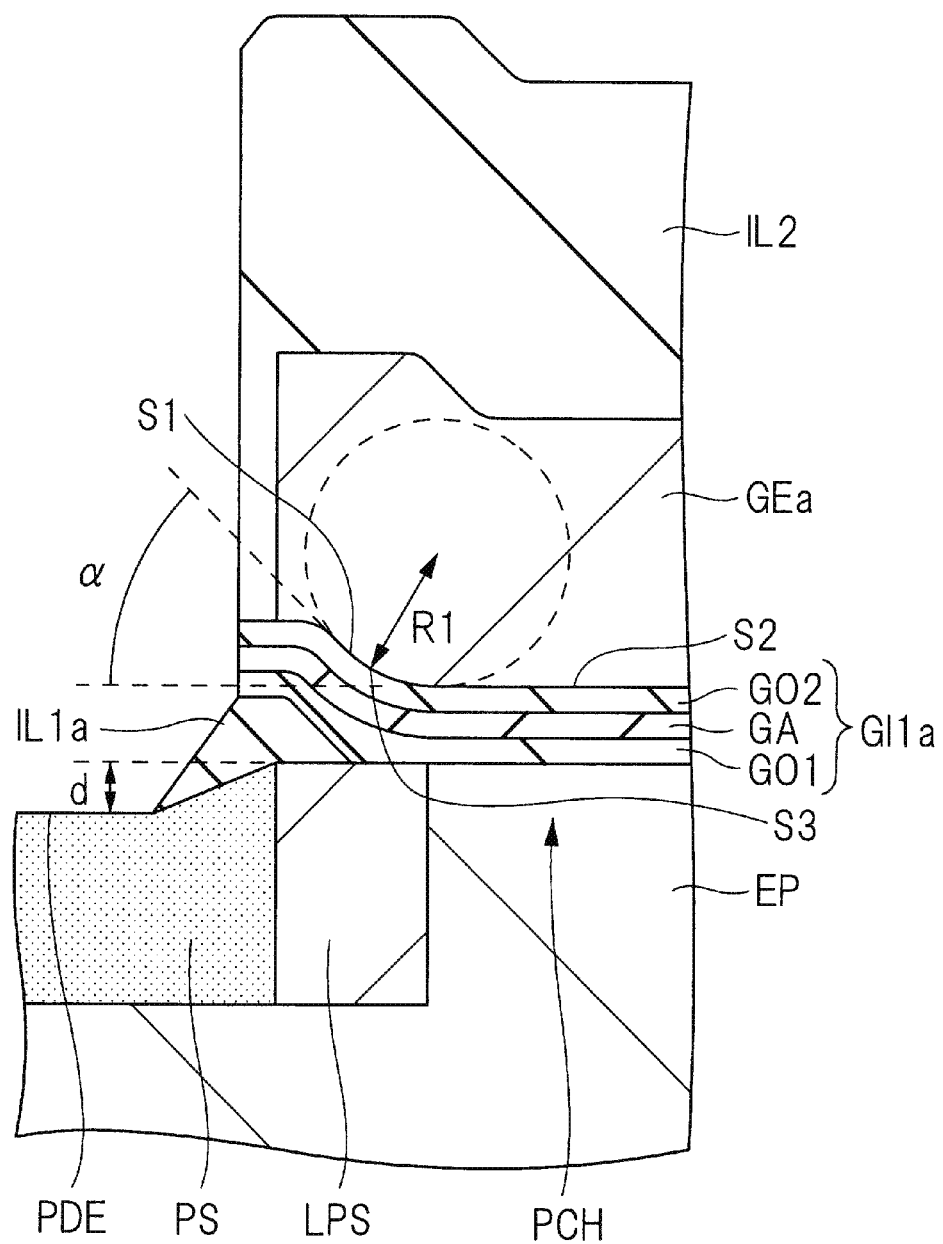
FIG. 2 is an enlarged cross sectional view of the main components of the gate electrode of a p-channel MOSFET included in the semiconductor device according to the embodiment.

FIG. 1 is a cross sectional view of a semiconductor device according to a first embodiment. FIG. 1 is a cross sectional view of a semiconductor device having a p-channel MOSFET and an n-channel MOSFET on a SiC substrate, for example. FIG. 2 is an enlarged cross sectional view of the end portion of the gate electrode of the semiconductor device according to the embodiment.

An $n^+$ SiC substrate SUB shown in FIG. 1 is made of silicon carbide (SiC). The $n^+$ SiC substrate SUB includes an n-type impurity (e.g. nitrogen (N) or phosphorus (P)). The $n^+$ SiC substrate SUB has a region AR1 and a region AR2. The regions AR1 and AR2 correspond to different flat regions on the same principal surface of the SiC substrate SUB. In the embodiment, a p-channel MOSFET is formed in the region AR1, and an n-channel MOSFET is formed in the region AR2. Note that the regions AR1 and AR2 may be adjacent to each other or not. However, for easy understanding, in FIG. 1, the regions AR1 and AR2 are illustrated in such a manner that the regions AR1 and AR2 are adjacent to each other in this order.

As shown in FIG. 1, on the front surface (a first principal surface) of the $n^+$ SiC substrate SUB, an $n^-$ epitaxial layer EP is formed. The layer EP is made of silicon carbide (SiC) having an impurity concentration lower than the impurity concentration of the $n^+$ SiC substrate SUB. The $n^-$ epitaxial layer EP includes an n-type impurity (e.g. nitrogen (N) or phosphorus (P)). The thickness of the $n^-$ epitaxial layer EP ranges from approximately 5.0 to 100.0 μm, for example. The impurity concentration of the $n^+$ SiC substrate SUB preferably ranges from approximately $1\times10^{18}$ to $1\times10^{21}$ $cm^{-3}$. The impurity concentration of the $n^-$ epitaxial layer EP preferably ranges from approximately $1\times10^{14}$ to $1\times10^{18}$ $cm^{-3}$.

First, as shown in FIG. 1, the structure of the p-channel MOSFET according to the embodiment formed in the region AR1 will be described. In the $n^-$ epitaxial layer EP, a $p^{++}$ source region (a first source region) PS and a $p^{++}$ drain region (a first drain region) PD having a predetermined depth from the surface of the $n^-$ epitaxial layer EP are formed. The $p^{++}$ source region PS and the $p^{++}$ drain region PD include a p-type impurity (e.g. boron (B) or aluminum (Al)). The depths of the $p^{++}$ source region PS and the $p^{++}$ drain region PD from the surface of the $n^-$ epitaxial layer EP range from approximately 0.1 to 0.5 μm, for example, and are preferably 0.4 μm. The impurity concentrations of the $p^{++}$ source region PS and the $p^{++}$ drain region PD are $5\times10^{20}$ $cm^{-3}$ or more, and preferably range from approximately $5\times10^{20}$ to $5\times10^{21}$ $cm^{-3}$.

Note that as shown in FIGS. 1 and 2, since the $p^{++}$ source region PS and the $p^{++}$ drain region PD have high impurity concentrations, the crystallizability of the regions PS and PD is reduced, resulting in a distorted structure. Thus, a recess PDE is formed in the $p^{++}$ source region PS and the $p^{++}$ drain region PD. In FIG. 1, as an example, the recess PDE is depicted in an inverted trapezoidal shape. However, the shape is actually indefinite. Although not shown in FIG. 1, rough irregularities are formed on the surface of the recess PDE. As shown in FIG. 2, a depth d of the recess PDE is approximately 50 nm from the surface of the $n^-$ epitaxial layer EP.

As shown in FIG. 1, in the $n^-$ epitaxial layer EP, a $p^+$ source region (a first low concentration source region) LPS is formed at the end portion of the $p^{++}$ source region PS on the $p^{++}$ drain region PD side. In the $n^-$ epitaxial layer EP, a $p^+$ drain region (a first low concentration drain region) LPD is formed at the end portion of the $p^{++}$ drain region PD on the $p^{++}$ source region PS side. The $p^+$ source region LPS and the $p^+$ drain region LPD include a p-type impurity (e.g. boron (B) or aluminum (Al)). The depth of the $p^+$ source region LPS and the depth of the $p^+$ drain region LPD from the surface of the $n^-$ epitaxial layer EP are the same as or shallower than the depths of the $p^{++}$ source region PS and the $p^{++}$ drain region PD from the surface of the $n^-$ epitaxial layer EP. The depths of the regions LPS and LPD range from approximately 0.1 to 0.5 μm, for example, and are preferably 0.2 μm. In FIG. 1, as an example, the depth of the $p^+$ source region LPS and the depth of the $p^+$ drain region LPD from the surface of the $n^-$ epitaxial layer EP are depicted the same as the depths of the $p^{++}$ source region PS and the $p^{++}$ drain region PD from the surface of the $n^-$ epitaxial layer EP.

The impurity concentrations of the $p^+$ source region LPS and the $p^+$ drain region LPD are $1\times10^{20}$ $cm^{-3}$ or less, and preferably range from approximately $1\times10^{18}$ to $1\times10^{20}$ $cm^{-3}$. Since the impurity concentrations of the $p^+$ source region LPS and the $p^+$ drain region LPD are not so high, compared with the impurity concentrations of the $p^{++}$ source region PS and the $p^{++}$ drain region PD, the crystallizability of the $p^+$ source region LPS and the $p^+$ drain region LPD is not reduced, and the flatness is maintained. Thus, no recess is formed in the $p^+$ source region LPS and the $p^+$ drain region LPD, like the recess formed in the $p^{++}$ source region PS and the $p^{++}$ drain region PD.

The region between the $p^+$ source region LPS and the $p^+$ drain region LPD in the $n^-$ epitaxial layer EP functions as a channel region (a first channel region) PCH. The surfaces of the $p^{++}$ source region PS and the $p^{++}$ drain region PD are more recessed than the surface of the channel region PCH (the height positions are lower than the channel region surface relative to the SiC substrate SUB). However, the surfaces of the p+ source region LPS and the p+ drain region LPD are not recessed from the surface of the channel region PCH (the height positions are the same as the channel region surface relative to the SiC substrate SUB).

As shown in FIG. 1, on the n− epitaxial layer EP, insulating films IL1a and IL1b are formed. Specifically, on the p++ source region PS and the p+ source region LPS, the insulating film (a first insulating film) IL1a is formed, and on the p++ drain region PD and the p+ drain region LPD, the insulating film (a second insulating film) IL1b is formed. The insulating films IL1a and IL1b are composed of a silicon oxide film, for example. Note that as described later, on a p well region PW, insulating films IL1c and IL1d are formed.

The insulating films IL1a and IL1b are formed in a nearly mountain shape. Specifically, the end portion of the insulating film IL1a on the p+ source region LPS side has an inclined surface (a first inclined surface) where the thickness of the insulating film IL1a is reduced from the p+ source region LPS toward the channel region PCH. The angle of the inclined surface is 45° or more and less than 90° relative to the top surface of the p source region LPS (the top surface of the n− epitaxial layer EP). In the channel length direction, the end of the insulating film IL1a on the p+ source region LPS side is disposed almost in the center of the p+ source region LPS. That is, in the channel length direction, the insulating film IL1a covers the region from almost the center of the p+ source region LPS to the end portion of the p++ source region PS, but the insulating film IL1a does not cover the region from almost the center of the p+ source region LPS to the end portion of the channel region PCH.

The end portion of the insulating film IL1a on the p++ source region PS side has an inclined surface (a fifth inclined surface) where the thickness of the insulating film IL1a is reduced from the p+ source region LPS toward the recess PDE of the p++ source region PS. The angle of the inclined surface is 45° or more and less than 90° relative to the recess PDE.

The end portion of the insulating film IL1b on the p+ drain region LPD side has an inclined surface (a second inclined surface) where the thickness of the insulating film IL1b is reduced from the p+ drain region LPD toward the channel region PCH. The angle of the inclined surface is 45° or more and less than 90° relative to the top surface of the p+ drain region LPD (the top surface of the n− epitaxial layer EP). In the channel length direction, the end of the insulating film IL1b on the p+ drain region LPD side is disposed almost in the center of the p+ drain region LPD. That is, in the channel length direction, the insulating film IL1b covers the region from almost the center of the p+ drain region LPD to the end portion of the p++ drain region PD, but the insulating film IL1b does not cover the region from almost the center of the p+ drain region LPD to the end portion of the channel region PCH.

The end portion of the insulating film IL1b on the p++ drain region PD side has an inclined surface (a sixth inclined surface) where the thickness of the insulating film IL1b is reduced from the p+ drain region LPD toward the recess PDE of the p++ drain region PD. The angle of the inclined surface is 45° or more and less than 90° relative to the recess PDE.

At the tops of the insulating films IL1a and IL1b, a face in parallel with the top surface of the n− epitaxial layer EP is formed. The distance between the parallel faces and the top surface of the n− epitaxial layer EP (the film thicknesses of the insulating films IL1a and IL1b) ranges from 0.1 to 0.5 μm, for example, and is preferably 0.3 μm.

On the channel region PCH, the p+ source region LPS, the p+ drain region LPD, and the insulating films IL1a and IL1b, a gate insulating film (a first gate insulating film) GI1a is formed. The gate insulating film GI1a is in contact with the channel region PCH, the p+ source region LPS that is not covered with the insulating film IL1a, and the p+ drain region LPD that is not covered with the insulating film IL1b. The gate insulating film GI1a is placed over the p++ source region PS and the p++ drain region PD in a planar view. However, since the insulating film IL1a is present between the gate insulating film GI1a and the p++ source region PS, the gate insulating film GI1a is not in contact with the p++ source region PS. Similarly, since the insulating film IL1b is present between the gate insulating film GI1a and the p++ drain region PD, the gate insulating film GI1a is not in contact with the p++ drain region PD.

The gate insulating film GI1a is placed on the inclined surface (the first inclined surface) formed at the end portion of the insulating film IL1a on the p+ source region LPS side and the inclined surface (the second inclined surface) formed at the end portion of the insulating film IL1b on the p+ drain region LPD side. The end portions of the gate insulating film GI1a are individually disposed on the faces formed at the tops of the insulating films IL1a and IL1b in parallel with the top surface of the n− epitaxial layer EP.

The gate insulating film GI1a according to the embodiment is formed as a film stack having an insulating film GO1, an insulating film GA formed on the insulating film GO1, and an insulating film GO2 formed on the insulating film GA. The insulating films GO1 and GO2 are composed of a silicon oxide film, for example. The insulating film GA is formed of an aluminum oxide film. The film thickness of the insulating film GA preferably ranges from 7 to 10 nm. The film thicknesses of the insulating films GO1 and GO2 preferably range from 5 to 20 nm. As described later, the gate insulating film GI1a only has to include at least the insulating film GA. Thus, the gate insulating film GI1a may be composed of the insulating film GA formed only of an aluminum oxide film, or may be composed of a film stack having the insulating film GO1 and the insulating film GA formed on the insulating film GO1. The gate insulating film GI1a may be composed of a film having the insulating film GO1 and the insulating film GA in turn stacked, like a stack of the insulating film GO1, the insulating film GA, the insulating film GO1, the insulating film GA, and so on.

On the gate insulating film GI1a, a gate electrode (a first gate electrode) GEa is formed. The gate electrode GEa is made of polysilicon, for example. The film thickness of the gate electrode GEa ranges from 0.1 to 0.5 μm, for example. The gate electrode GEa is placed over the channel region PCH, the p+ source region LPS, and the p+ drain region LPD in a planar view.

The gate electrode GEa formed on the gate insulating film GI1a has a cross sectional form similar to the gate insulating film GI1a. That is, the gate electrode GEa is placed on the inclined surface (the first inclined surface) formed at the end portion of the insulating film IL1a on the p+ source region LPS side and the inclined surface (the second inclined surface) formed at the end portion of the insulating film IL1b on the p+ drain region LPD side through the gate insulating film GI1a. The end portions of the gate electrode GEa are individually disposed on the faces formed at the tops of the insulating films IL1a and IL1b in parallel with the top surface of the n− epitaxial layer EP through the gate insulating film GI1a. Specifically, as shown in FIG. 2, an angle α at which the under surface of the gate electrode GEa (the surface in contact with the gate insulating film GI1a) is placed on the inclined surface formed at the end portion of the insulating film IL1a on the $p^+$ source region LPS side through the gate insulating film GI1a is 45° or more and less than 90°. Similarly, although not shown in the drawing, the angle at which the under surface of the gate electrode GEa is placed on the inclined surface formed at the end portion of the insulating film IL1b on the $p^+$ drain region LPD side through the gate insulating film GI1a is 45° or more and less than 90°.

Therefore, as shown in FIGS. 1 and 2, the distance between the under surface of the gate electrode GEa (the surface in contact with the gate insulating film GI1a) and the top surfaces of the channel region PCH, the $p^+$ source region LPS, and the $p^{++}$ source region PS (the top surface of the $n^-$ epitaxial layer EP) is constant from the channel region PCH to almost the center of the $p^+$ source region LPS in the channel length direction, (the under surface is apart from the top surfaces by the thickness of the gate insulating film GI1a). The distance between the under surface of the gate electrode GEa and the top surfaces of the channel region PCH, the $p^+$ source region LPS, and the $p^{++}$ source region PS is increased from almost the center of the $p^+$ source region LPS toward the $p^{++}$ source region PS (the under surface is apart from the top surfaces by the total thickness of the thicknesses of the gate insulating film GI1a and the insulating film IL1a).

Similarly, as shown in FIG. 1, the distance between the under surface of the gate electrode GEa and the top surfaces of the channel region PCH, the $p^+$ drain region LPD, and the $p^{++}$ drain region PD (the top surface of the $n^-$ epitaxial layer EP) is constant from the channel region PCH to almost the center of the $p^+$ drain region LPD in the channel length direction (the under surface is apart from the top surfaces by the thickness of the gate insulating film GI1a). The distance between the under surface of the gate electrode GEa and the top surfaces of the channel region PCH, the $p^+$ drain region LPD, and the $p^{++}$ drain region PD is increased from almost the center of the $p^+$ drain region LPD toward the $p^{++}$ drain region PD (the under surface is apart from the top surfaces by the total thickness of the thicknesses of the gate insulating film GI1a and the insulating film IL1b).

Note that as shown in FIG. 2, when the under surface of the gate electrode GEa on the insulating film IL1a side is separated into a first under surface S1 in parallel with the inclined surface (the first inclined surface) at the end portion of the insulating film IL1a, a second under surface S2 in parallel with the top surface of the channel region PCH, and a third under surface S3 connecting the first under surface S1 to the second under surface S2, the third under surface S3 preferably includes a curved surface. In this case, a part of the curved surface of the third under surface S3 of the gate electrode GEa can be approximated to an arc, and the part has a curvature radius R1. Although the curvature radius R1 varies depending on the type of the gate insulating film GI1a, the curvature radius R1 is preferably 1.8 times or more of the film thickness of the gate insulating film GI1a, which is 10 nm or more, for example. Note that the same thing is applied to the under surface of the gate electrode GEa on the insulating film IL1b side and the under surface of a gate electrode GEb, described later, on the insulating film IL1c side and the insulating film IL1d side. That is, when the under surface is separated into a first under surface in parallel with the inclined surface at the end portion of the insulating film IL1b (IL1c and IL1d), a second under surface in parallel with the top surface of a channel region PCH (NCH), and a third under surface connecting the first under surface to the second under surface, the third under surface preferably includes a curved surface.

The gate insulating film GI1a and the gate electrode GEa is covered with an insulating film (a third insulating film) IL2. The insulating film IL2 is composed of a silicon oxide film, for example.

On the $p^{++}$ source region PS and the insulating film IL2, a source wiring electrode M1a is formed. The $p^{++}$ source region PS is electrically connected to the source wiring electrode M1a. Similarly, on the $p^{++}$ drain region PD and the insulating film IL2, a drain wiring electrode M1b is formed. The $p^{++}$ drain region PD is electrically connected to the drain wiring electrode M1b. Although not shown in the drawing, the gate electrode GEa is electrically connected to a gate wiring electrode. The source wiring electrode M1a and the drain wiring electrode M1b shown in FIG. 1 are formed of a film stack having a titanium (Ti) film, a titanium nitride (TiN) film, and an aluminum (Al) film, for example. Although not shown in the drawing, similarly, the gate wiring electrode is also formed of a film stack having a titanium (Ti) film, a titanium nitride (TiN) film, and an aluminum (Al) film, for example. A source potential is externally applied to the source wiring electrode M1a. A drain potential is externally applied to the drain wiring electrode M1b. A gate potential is externally applied to the gate wiring electrode.

Next, as shown in FIG. 1, the structure of the n-channel MOSFET according to the embodiment formed in the region AR2 will be described. In the $n^-$ epitaxial layer EP, the p well region PW having a predetermined depth from the surface of the $n^-$ epitaxial layer EP is formed. The depth of the p well region PW from the surface of the $n^-$ epitaxial layer EP is approximately 1.0 μm, for example. The impurity concentration of the p well region PW preferably ranges from approximately $5 \times 10^{16}$ to $1 \times 10^{19}$ $cm^{-3}$.

In the p well region PW, an $n^{++}$ source region (a second source region) NS and an $n^{++}$ drain region (a second drain region) ND having a predetermined depth from the surface of the $n^-$ epitaxial layer EP are formed. The $n^{++}$ source region NS and the $n^{++}$ drain region ND are formed apart from the end side surfaces of the p well region PW. The depths from the surfaces of the $n^{++}$ source region NS and the $n^{++}$ drain region ND in the p well region PW, i.e. the depth from the surface of the $n^-$ epitaxial layer EP approximately ranges from 0.1 to 0.5 μm, for example, and is preferably 0.4 μm. The impurity concentrations of the $n^{++}$ source region NS and the $n^{++}$ drain region ND are $5 \times 10^{20}$ $cm^{-3}$ or more, and preferably range from approximately $5 \times 10^{20}$ to $5 \times 10^{21}$ $cm^{-3}$.

Note that since the $n^{++}$ source region NS and the $n^{++}$ drain region ND have high impurity concentrations, the crystallizability of the regions NS and ND is reduced, resulting in a distorted structure. Thus, in the $n^{++}$ source region NS and the $n^{++}$ drain region ND, a recess NDE is formed. In FIG. 1, the recess NDE is depicted in an inverted trapezoidal shape. However, the shape is actually indefinite. On the surface of the recess NDE, rough irregularities are formed. The depth of the recess NDE is approximately 50 nm from the surface of the p well region PW, i.e. from the surface of the $n^-$ epitaxial layer EP.

As shown in FIG. 1, in the p well region PW, an $n^+$ source region (a second low concentration source region) LNS is formed at the end portion of the $n^{++}$ source region NS on the $n^{++}$ drain region ND side. In the p well region PW, an $n^+$ drain region (a second low concentration drain region) LND is formed at the end portion of the n$^{++}$ drain region ND on the n$^{++}$ source region NS side. The depths from the surfaces of the n$^+$ source region LNS and the n$^+$ drain region LND in the p well region PW, i.e. the depth from the surface of the n$^-$ epitaxial layer EP is the same as or shallower than the depths from the surfaces of the n$^{++}$ source region NS and the n$^{++}$ drain region ND in the p well region PW (the surface of the n$^-$ epitaxial layer EP), which approximately ranges from 0.1 to 0.5 μm and is preferably 0.2 μm. The impurity concentrations of the n$^+$ source region LNS and the n$^+$ drain region LND are $1\times10^{20}$ cm$^{-3}$ or less, and preferably range from approximately $1\times10^{18}$ to $1\times10^{20}$ cm$^{-3}$. Since the impurity concentrations of the n$^+$ source region LNS and the n$^+$ drain region LND are not so high, compared with the impurity concentrations of the n$^{++}$ source region NS and the n$^{++}$ drain region ND, the crystallizability of the region LNS and LND is not reduced, and the flatness is maintained. Thus, no recess is formed in the n$^+$ source region LNS and the n$^+$ drain region LND like a recess formed in the n$^{++}$ source region NS and the n$^{++}$ drain region ND.

The region between the n$^+$ source region LNS and the n$^+$ drain region LND in the p well region PW functions as the channel region (the second channel region) NCH. The surfaces of the n$^{++}$ source region NS and the n$^{++}$ drain region ND are more recessed than the surface of the channel region NCH (the height positions are low relative to the SiC substrate SUB). However, the surfaces of the n$^+$ source region LNS and the n$^+$ drain region LND are not recessed below the surface of the channel region NCH (the height positions are the same relative to the SiC substrate SUB).

As shown in FIG. 1, on the p well region PW, the insulating films IL1c and IL1d are formed. That is, on the n$^{++}$ source region NS and the n$^+$ source region LNS, the insulating film (the fourth insulating film) IL1c is formed, and on the n$^{++}$ drain region ND and the n$^+$ drain region LND, the insulating film (the fifth insulating film) IL1d is formed.

The insulating films IL1c and IL1d are formed in a nearly mountain shape. Specifically, the end portion of the insulating film IL1c on the n$^+$ source region LNS side has an inclined surface (a third inclined surface) where the thickness of the insulating film IL1c is reduced from the n$^+$ source region LNS toward the channel region NCH. The angle of the inclined surface is 45° or more and less than 90° relative to the top surface of the n$^+$ source region LNS (the top surface of the n$^-$ epitaxial layer EP). In the channel length direction, the end of the insulating film IL1c on the n$^+$ source region LNS side is disposed almost in the center of the n$^+$ source region LNS. That is, in the channel length direction, the insulating film IL1c covers the region from almost the center of the n$^+$ source region LNS to the end portion of the n$^{++}$ source region NS, but the insulating film IL1c does not cover the region from almost the center of the n$^+$ source region LNS to the end portion of the channel region NCH.

The end portion of the insulating film IL1c on the n$^{++}$ source region NS side has an inclined surface (a seventh inclined surface) where the thickness of the insulating film IL1c is reduced from the n$^+$ source region LNS toward the recess NDE of the n$^{++}$ source region NS. The angle of the inclined surface is 45° or more and less than 90° relative to the recess NDE.

The end portion of the insulating film IL1d on the n$^+$ drain region LND side has an inclined surface (a fourth inclined surface) where the thickness of the insulating film IL1d is reduced from the n$^+$ drain region LND toward the channel region NCH. The angle of the inclined surface is 45° or more and less than 90° relative to the top surface of the n$^+$ drain region LND (the top surface of the n$^-$ epitaxial layer EP). In the channel length direction, the end of the insulating film IL1d on the n$^+$ drain region LND side is disposed almost in the center of the n$^+$ drain region LND. That is, in the channel length direction, the insulating film IL1d covers the region from almost the center of the n$^+$ drain region LND to the end portion of the n$^{++}$ drain region ND, but the insulating film IL1d does not cover the region from almost the center of the n$^+$ drain region LND to the end portion of the channel region NCH.

The end portion of the insulating film IL1d on the n$^{++}$ drain region ND side has an inclined surface (an eighth inclined surface) where the thickness of the insulating film IL1d is reduced from the n$^+$ drain region LND toward the recess NDE of the n$^{++}$ drain region ND. The angle of the inclined surface is 45° or more and less than 90° relative to the recess NDE.

At the tops of the insulating films IL1c and IL1d, a face in parallel with the top surface of the p well region PW (the n$^-$ epitaxial layer EP) is formed. The distance (the film thicknesses of the insulating films IL1c and IL1d) between the parallel faces and the top surface of the p well region PW (the n$^-$ epitaxial layer EP) ranges from 0.1 to 0.5 μm, for example, and is preferably 0.3 μm.

On the channel region NCH, the n$^+$ source region LNS, the n$^+$ drain region LND, and the insulating films IL1c and IL1d, a gate insulating film (a second gate insulating film) GI1b is formed. The gate insulating film GI1b is in contact with the channel region NCH, the n$^+$ source region LNS that is not covered with the insulating film IL1c, and the n$^+$ drain region LND that is not covered with the insulating film IL1d. The gate insulating film GI1b is placed over the n$^{++}$ source region NS and the n$^{++}$ drain region ND in a planar view. However, since the insulating film IL1c is present between the gate insulating film GI1b and the n$^{++}$ source region NS, the gate insulating film GI1b is not in contact with the n$^{++}$ source region NS. Similarly, since the insulating film IL1d is present between the gate insulating film GI1b and the n$^{++}$ drain region ND, the gate insulating film GI1b is not in contact with the n$^{++}$ drain region ND.

The gate insulating film GI1b is placed on the inclined surface (the third inclined surface) formed at the end portion of the insulating film IL1c on the n$^+$ source region LNS side and the inclined surface (the fourth inclined surface) formed at the end portion of the insulating film IL1d on the n$^+$ drain region LND side. The end portions of the gate insulating film GI1b are individually disposed on the faces formed at the tops of the insulating films IL1c and IL1d in parallel with the top surfaces of the p well region PW (the n$^-$ epitaxial layer).

Similarly to the p-channel MOSFET described above, the gate insulating film GI1b is formed of the insulating film GO1, the insulating film GA formed on the insulating film GO1, and the insulating film GO2 formed on the insulating film GA. The gate insulating film GI1b may be composed of the insulating film GA formed only of an aluminum oxide film, or may be composed of a film stack having the insulating film GO1 and the insulating film GA formed on the insulating film GO1. The gate insulating film GI1b may be composed of a film having the insulating film GO1 and the insulating film GA in turn stacked, like a stack of the insulating film GO1, the insulating film GA, the insulating film GO1, the insulating film GA, and so on. As described later, the gate insulating film GI1b may be composed only of an insulating film formed of a silicon oxide film.

Similarly to the p-channel MOSFET, on the gate insulating film GI1b, the gate electrode (the second gate electrode) GEb is formed. The gate electrode GEb is formed on the gate insulating film GI1b. The gate electrode GEb is placed over the channel region NCH, the n$^+$ source region LNS, and the n$^+$ drain region LND in a planar view.

The gate electrode GEb formed on the gate insulating film GI1b also has a cross sectional form similar to the gate insulating film GI1b. That is, the gate electrode GEb is placed on the inclined surface (the third inclined surface) formed at the end portion of the insulating film IL1c on the n$^+$ source region LNS side and the inclined surface (the fourth inclined surface) formed at the end portion of the insulating film IL1d on the n$^+$ drain region LND side through the gate insulating film GI1b. The end portions of the gate electrode GEb are individually disposed on the faces formed at the tops of the insulating films IL1c and IL1d in parallel with the top surfaces of the p well region PW (the n$^-$ epitaxial layer) through the gate insulating film GI1b.

Although not shown in the drawing, an angle formed by the under surface of the gate electrode GEb (the surface in contact with the gate insulating film GI1b) and the top surface of the n$^{++}$ source region NS (the top surface of the p well region PW) is 45° or more and less than 90°.

Therefore, the distance between the under surface of the gate electrode GEb (the surface in contact with the gate insulating film GI1b) and the top surfaces of the channel region NCH, the n$^+$ source region LNS, and the n$^{++}$ source region NS (the top surface of the n$^-$ epitaxial layer EP) is constant from the channel region NCH to almost the center of the n$^+$ source region LNS in the channel length direction (the under surface is apart from the top surfaces by the thickness of the gate insulating film GI1b). The distance between the under surface of the gate electrode GEb and the top surfaces of the channel region NCH, the n$^+$ source region LNS, and the n$^{++}$ source region NS is increased from almost the center of the n$^+$ source region LNS toward the n$^{++}$ source region NS (the under surface is apart from the top surfaces by the total thickness of the thicknesses of the gate insulating film GI1b and the insulating film IL1c).

Similarly, the distance between the under surface of the gate electrode GEb (the surface in contact with the gate insulating film GI1b) and the top surfaces of the channel region NCH, the n$^+$ drain region LND, and the n$^{++}$ drain region ND (the top surface of the n$^-$ epitaxial layer EP) is constant from the channel region NCH to almost the center of the n$^+$ drain region LND in the channel length direction (the under surface is apart from the top surfaces by the thickness of the gate insulating film GI1b). The distance between the under surface of the gate electrode GEb and the top surfaces of the channel region NCH, the n$^+$ drain region LND, and the n$^{++}$ drain region ND is increased from almost the center of the n$^+$ drain region LND toward the n$^{++}$ drain region ND (the under surface is apart from the top surfaces by the total thickness of the thicknesses of the gate insulating film GI1b and the insulating film IL1d).

Similarly to the p-channel MOSFET, the gate insulating film GI1b and the gate electrode GEb are covered with the insulating film IL2.

On the n$^{++}$ source region NS and the insulating film IL2, a source wiring electrode M1c is formed. The n$^{++}$ source region NS is electrically connected to the source wiring electrode M1c. Similarly, on the n$^{++}$ drain region ND and the insulating film IL2, a drain wiring electrode M1d is formed. The n$^{++}$ drain region ND is electrically connected to the drain wiring electrode M1d. Although not shown in the drawing, the gate electrode GEb is electrically connected to a gate wiring electrode. A source potential is externally applied to the source wiring electrode M1c. A drain potential is externally applied to the drain wiring electrode M1d. A gate potential is externally applied to the gate wiring electrode.

Note that as shown in FIG. 1, on the n$^-$ epitaxial layer EP where the p-channel and the n-channel MOSFETs are not formed (partially including the surfaces on the p$^{++}$ source region PS, the p$^{++}$ drain region PD, the p well region PW, the n$^{++}$ source region NS, and the n$^{++}$ drain region ND), the insulating films IL1, GO1, GA, and GO2 are left as field insulating films. An example of the field insulating film may be a silicon oxide film, which is non-limiting.

Fabrication Processes of the Semiconductor Device

Next, the fabrication processes of the semiconductor device according to the embodiment will be described, and the structure of the semiconductor device according to the embodiment will be more clearly described. FIGS. 3 to 17 are cross sectional views of the main components in the fabrication processes of the semiconductor device according to the embodiment, showing the cross sections corresponding to FIG. 1.

Figure 3:
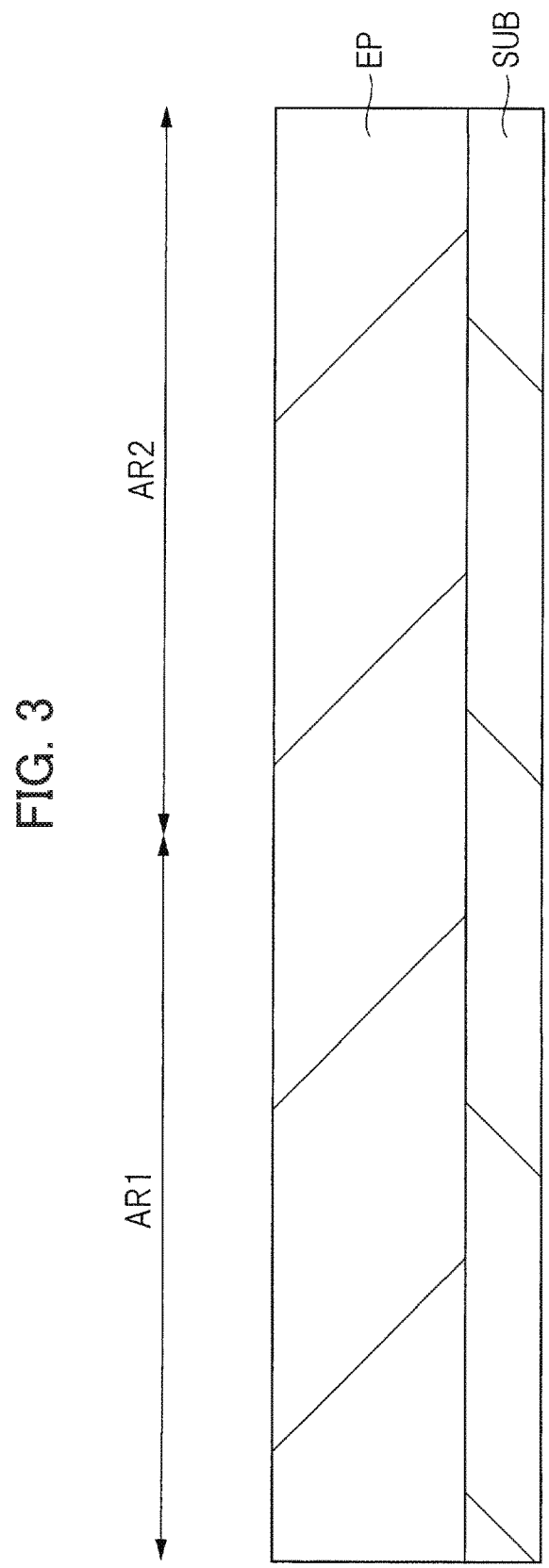
FIG. 3 is a cross sectional view of the main components in the fabrication processes of the semiconductor device according to the embodiment.

First, as shown in FIG. 3, the n$^+$ SiC substrate SUB, for example, is prepared. The n$^+$ SiC substrate SUB is doped with an n-type impurity. An example of the n-type impurity is nitrogen (N) or phosphorus (P). The impurity concentration of the n-type impurity ranges from approximately $1 \times 10^{18}$ to $1 \times 10^{21}$ cm$^{-3}$, for example. The thickness of the n$^+$ SiC substrate SUB is approximately 350 μm, for example. For the n$^+$ SiC substrate SUB, an n$^+$ 4H—SiC wafer having an offset of 8°, 4°, 2°, or 0.5°, for example, is used.

Subsequently, the n$^-$ epitaxial layer EP made of silicon carbide (SiC) is formed on the front surface of the n$^+$ SiC substrate SUB by epitaxial growth. The n$^-$ epitaxial layer EP is doped with an n-type impurity having the impurity concentration lower than the impurity concentration of the n$^+$ SiC substrate SUB. The impurity concentration of the n$^-$ epitaxial layer EP ranges from approximately $1 \times 10^{14}$ to $1 \times 10^{18}$ cm$^{-3}$, for example. The thickness of the n$^-$ epitaxial layer EP ranges from 5.0 to 100.0 μm, for example.

Figure 4:
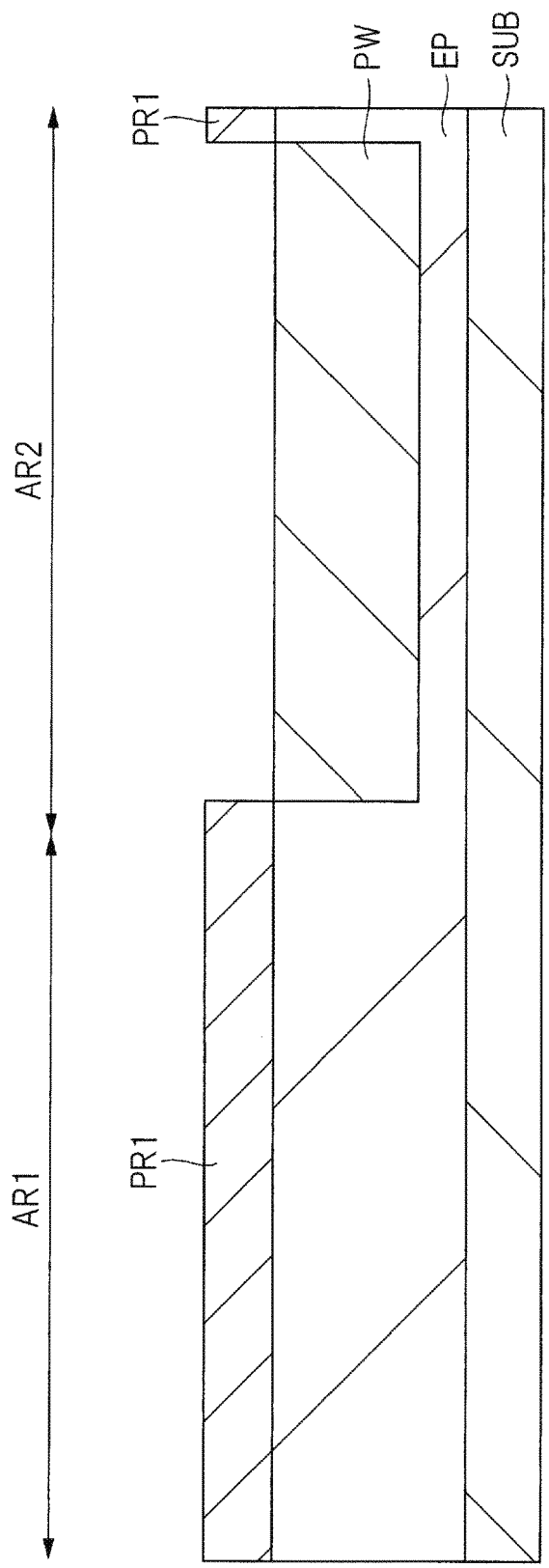
FIG. 4 is a cross sectional view of the main components in the fabrication processes of the semiconductor device subsequent to FIG. 3.

Subsequently, as shown in FIG. 4, a photoresist pattern PR1 formed by photolithography techniques is used as a mask (an ion implantation blocking mask), p-type impurity ions, boron (B) ions or aluminum (Al) ions, for example, are implanted into the n$^-$ epitaxial layer EP, and then the p well region PW is formed in the region AR2. The depth of the p well region PW from the surface of the n$^-$ epitaxial layer EP is approximately 1.0 μm, for example. The impurity concentration of the p well region PW ranges from approximately $5 \times 10^{16}$ to $1 \times 10^{19}$ cm$^{-3}$, for example. Note that a p-type epitaxial layer made of silicon carbide (SiC) may be further formed on the n$^-$ epitaxial layer EP by epitaxial growth to provide the p well region PW. After that, the photoresist pattern PR1 is removed.

Figure 5:
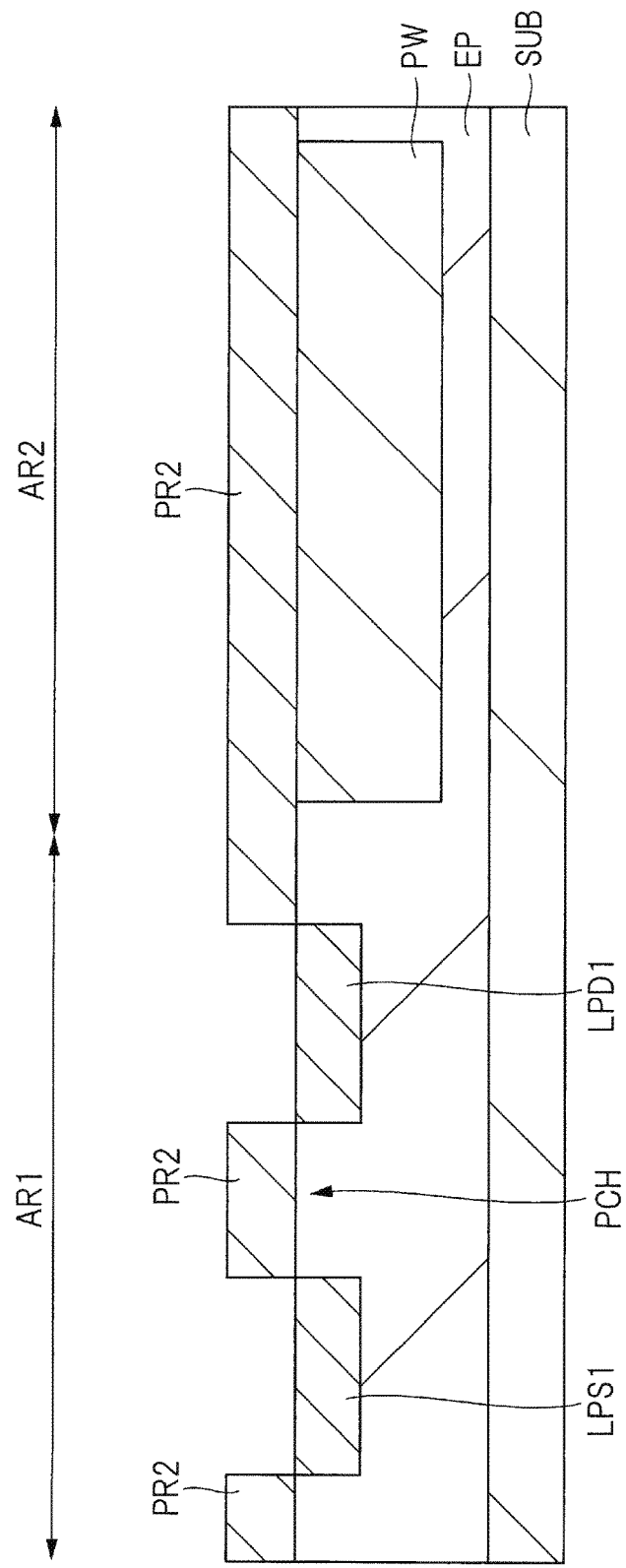
FIG. 5 is a cross sectional view of the main components in the fabrication processes of the semiconductor device subsequent to FIG. 4.

Subsequently, as shown in FIG. 5, a photoresist pattern PR2 formed by photolithography techniques is used as a mask, p-type impurity ions, boron (B) ions or aluminum (Al) ions, for example, are implanted into the n$^-$ epitaxial layer EP, and then the p$^+$ source region LPS1 and the p$^+$ drain region LPD1 are formed in the region AR1. The p$^+$ source region LPS1 is a region in which the p$^{++}$ source region PS and the p$^+$ source region LPS are formed by processes described later. The p$^+$ drain region LPD1 is a region in which the p$^{++}$ drain region PD and the p$^+$ drain region LPD are formed by processes described later. The depths of the p$^+$ source region LPS1 and the p$^+$ drain region LPD1 from the surface of the n$^-$ epitaxial layer EP range from approximately 0.1 to 0.5 μm, for example. The impurity concentrations of the p$^+$ source region LPS1 and the p$^+$ drain region LPD1 range from approximately $1\times10^{18}$ to $1\times10^{20}$ cm$^{-3}$, for example. After that, the photoresist pattern PR2 is removed.

Figure 6:
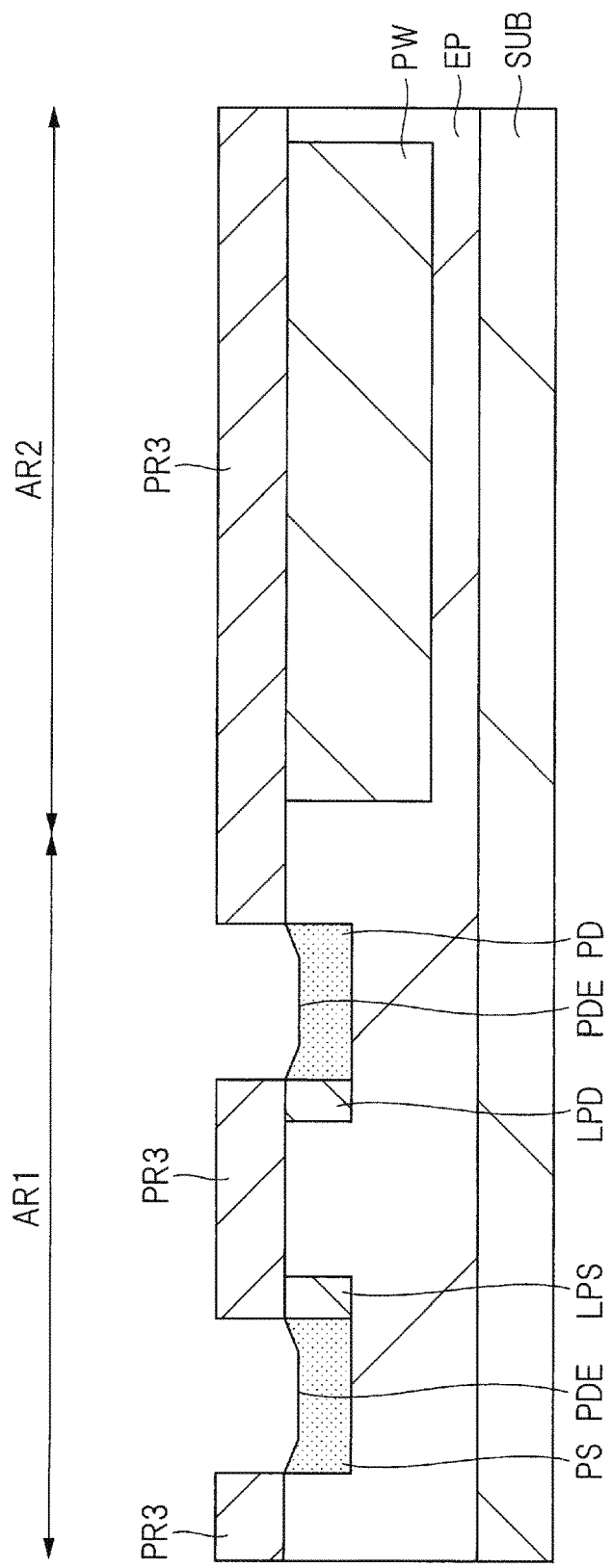
FIG. 6 is a cross sectional view of the main components in the fabrication processes of the semiconductor device subsequent to FIG. 5.

Subsequently, as shown in FIG. 6, a photoresist pattern PR3 formed by photolithography techniques is used as a mask, p-type impurity ions, boron (B) ions or aluminum (Al) ions, for example, are implanted into a part of the p$^+$ source region LPS1 and a part of the p$^+$ drain region LPD1, and the p$^{++}$ source region PS and the p$^{++}$ drain region PD are formed in the region AR1. The depths of the p$^{++}$ source region PS and the p$^{++}$ drain region PD from the surface of the n$^-$ epitaxial layer EP range from approximately 0.1 to 0.5 μm, for example. The impurity concentrations of the p$^{++}$ source region PS and the p$^{++}$ drain region PD range from approximately $5\times10^{20}$ to $5\times10^{21}$ cm$^{-3}$, for example. As shown in FIG. 6, since the p$^{++}$ source region PS and the p$^{++}$ drain region PD have high impurity concentrations, the crystallizability of the regions PS and PD is reduced, resulting in a distorted structure. Thus, the recess PDE is formed in the p$^{++}$ source region PS and the p$^{++}$ drain region PD. The depth of the recess PDE is approximately 50 nm from the surface of the n$^-$ epitaxial layer EP. Note that in the p$^+$ source region LPS1 and the p$^+$ drain region LPD1, the regions covered with the photoresist pattern PR3 where no p-type impurity ions are implanted are the p$^+$ source region LPS and the p$^+$ drain region LPD. After that, the photoresist pattern PR3 is removed.

Figure 7:
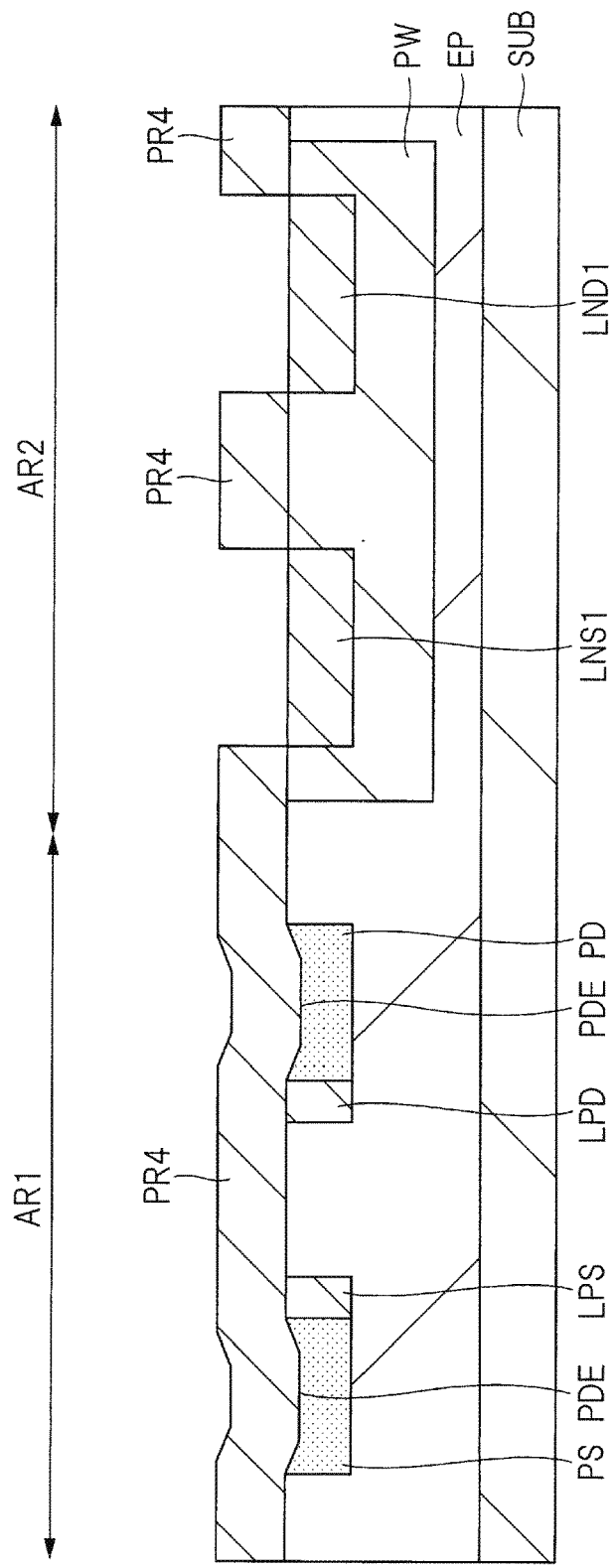
FIG. 7 is a cross sectional view of the main components in the fabrication processes of the semiconductor device subsequent to FIG. 6.

Subsequently, as shown in FIG. 7, a photoresist pattern PR4 formed by photolithography techniques is used as a mask, n-type impurity ions, nitrogen (N) ions or phosphorus (P) ions, for example, are implanted into the n$^-$ epitaxial layer EP, and then the n$^+$ source region LNS1 and the n$^+$ drain region LND1 are formed in the p well region PW in such a manner that the regions LNS1 and LND1 are apart from the end side surfaces of the p well region PW. The n$^+$ source region LNS1 is a region in which an n$^{++}$ source region NS and an n$^+$ source region LNS are formed by processes described later. The n$^+$ drain region LND1 is a region in which the n$^{++}$ drain region ND and the n$^+$ drain region LND are formed by processes described later. The depths of the n$^+$ source region LNS1 and the n$^+$ drain region LND1 from the surface of the n$^-$ epitaxial layer EP range from approximately 0.1 to 0.5 μm, for example. The impurity concentrations of the n$^+$ source region LNS1 and the n$^+$ drain region LND1 range from approximately $1\times10^{18}$ to $1\times10^{20}$ cm$^{-3}$, for example. After that, the photoresist pattern PR4 is removed.

Figure 8:
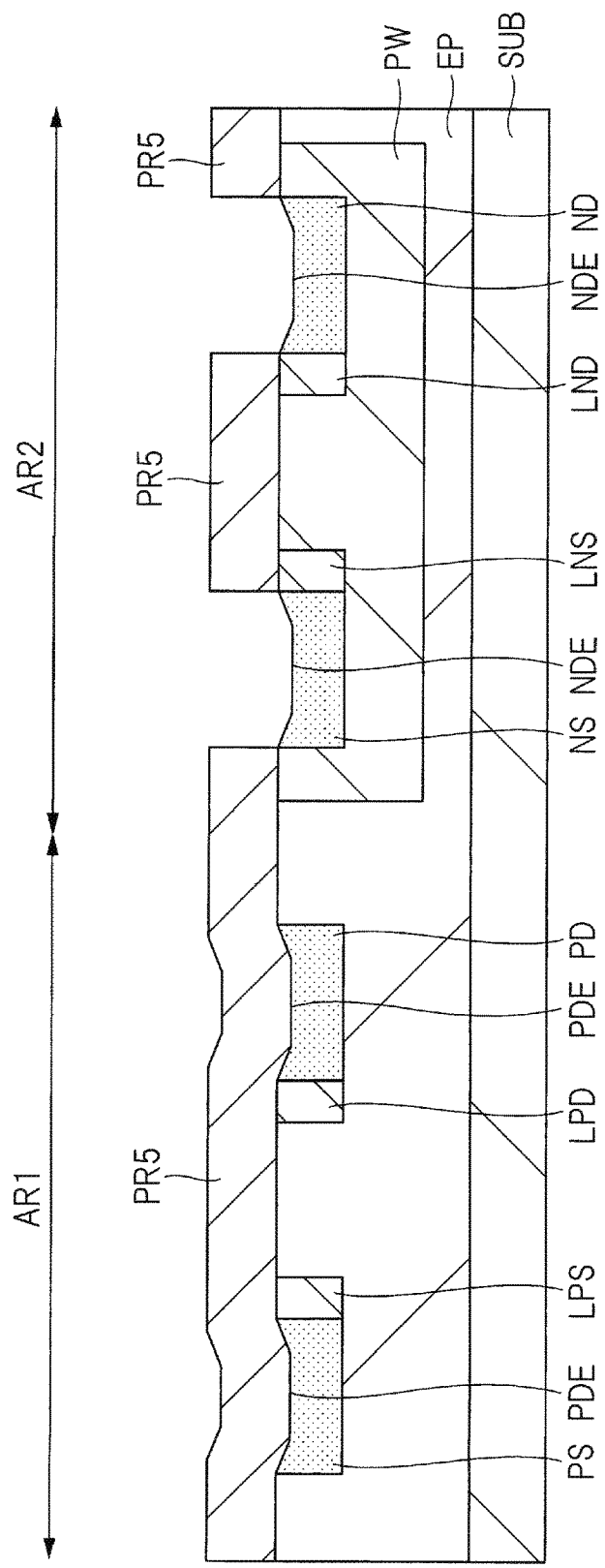
FIG. 8 is a cross sectional view of the main components in the fabrication processes of the semiconductor device subsequent to FIG. 7.

Subsequently, as shown in FIG. 8, a photoresist pattern PR5 formed by photolithography techniques is used as a mask, n-type impurity ions, nitrogen (N) ions or phosphorus (P) ions, for example, are implanted into a part of the n$^+$ source region LNS1 and a part of the n$^+$ drain region LND1, and the n$^{++}$ source region NS and the n$^{++}$ drain region ND are formed in the region AR2. The depths of the n$^{++}$ source region NS and the n$^{++}$ drain region ND from the surface of the n$^-$ epitaxial layer EP range from approximately 0.1 to 0.5 μm, for example. The impurity concentrations of the n$^{++}$ source region NS and the n$^{++}$ drain region ND range from approximately $5\times10^{20}$ to $5\times10^{21}$ cm$^{-3}$, for example. As shown in FIG. 8, since the n$^{++}$ source region NS and the n$^{++}$ drain region ND have high impurity concentrations, the crystallizability of the regions NS and ND is reduced, resulting in a distorted structure. Thus, in the n$^{++}$ source region NS and the n$^{++}$ drain region ND, the recess NDE is formed. The depth of the recess NDE is approximately 50 nm from the surface of the n$^-$ epitaxial layer EP. Note that in the n$^+$ source region LNS1 and the n$^+$ drain region LND1, the regions covered with the photoresist pattern PR5 where no n-type impurity ions are implanted are the n$^+$ source region LNS and the n$^+$ drain region LND. After that, the photoresist pattern PR5 is removed.

Subsequently, although not shown in the drawing, on the back surface of the n$^+$ SiC substrate SUB and the top surface of the n$^-$ epitaxial layer EP, a carbon (C) film is deposited by plasma chemical vapor deposition (CVD), for example. The thickness of the carbon film is approximately 0.03 μm, for example. Subsequently, the implanted impurity ions are activated by applying heat treatment to the n$^+$ SiC substrate SUB and the n$^-$ epitaxial layer EP at a temperature of approximately 1,600 to 1,800° C., for example. After the heat treatment, the carbon film is removed by oxygen plasma ashing, for example. Although not shown in the drawing, after the oxygen plasma ashing, a silicon oxide film is formed on the back surface of the n$^+$ SiC substrate SUB and the top surface of the n$^-$ epitaxial layer EP by thermal oxidation, for example, and the silicon oxide film is removed with hydrofluoric acid. Thus, the back surface of the n$^+$ SiC substrate SUB and the top surface of the n$^-$ epitaxial layer EP can be cleaner surfaces.

Figure 9:
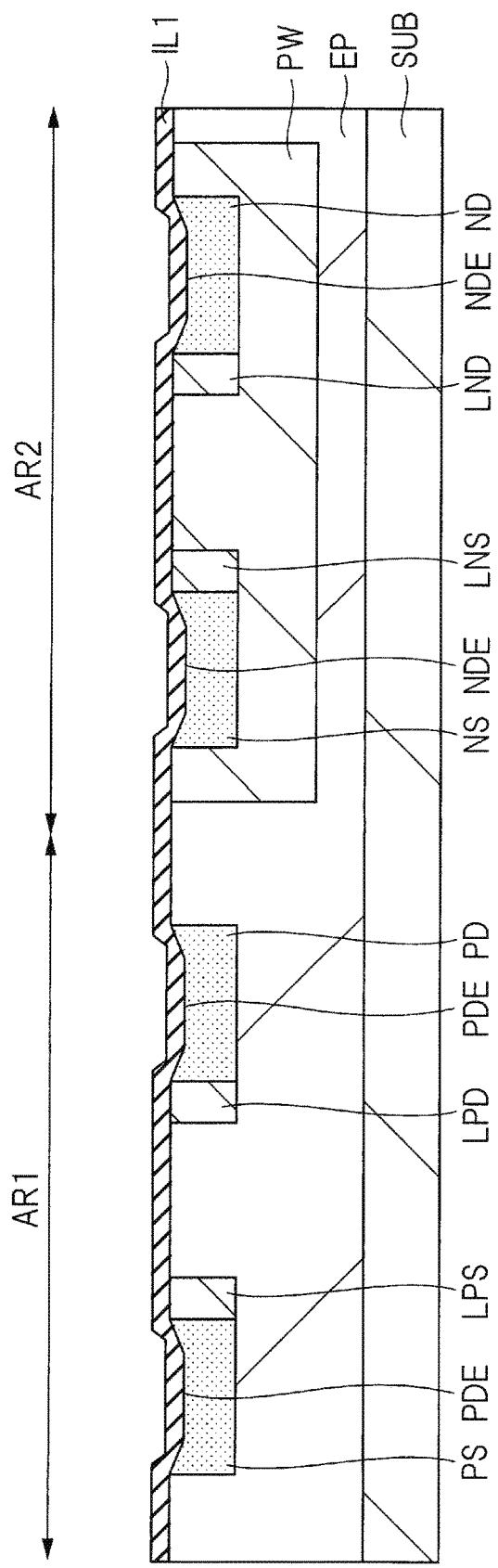
FIG. 9 is a cross sectional view of the main components in the fabrication processes of the semiconductor device subsequent to FIG. 8.

Subsequently, as shown in FIG. 9, the insulating film IL1 is formed on the top surface of the n$^-$ epitaxial layer EP by CVD or by thermal oxidation, for example. The insulating film IL1 is made of silicon oxide (SiO$_2$), for example. The thickness of the film IL1 ranges from approximately 0.1 to 0.5 μm, for example.

Figure 10:
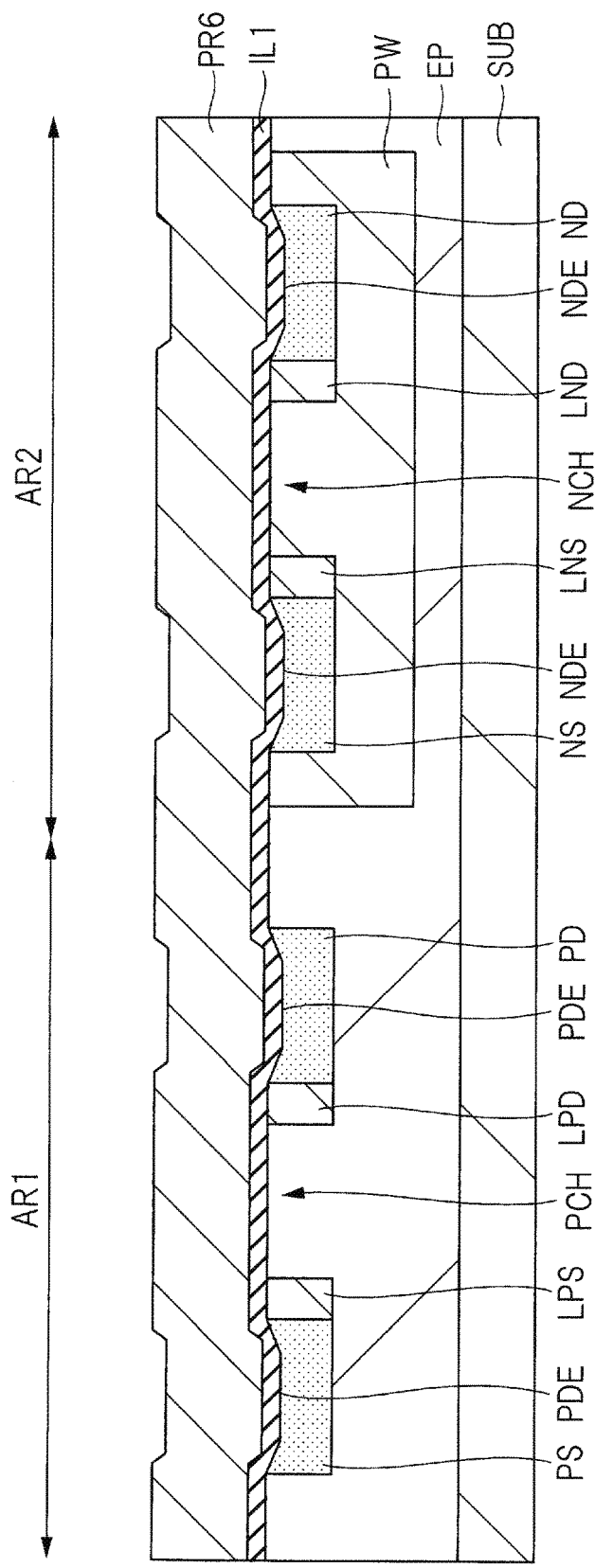
FIG. 10 is a cross sectional view of the main components in the fabrication processes of the semiconductor device subsequent to FIG. 9.
Figure 11:
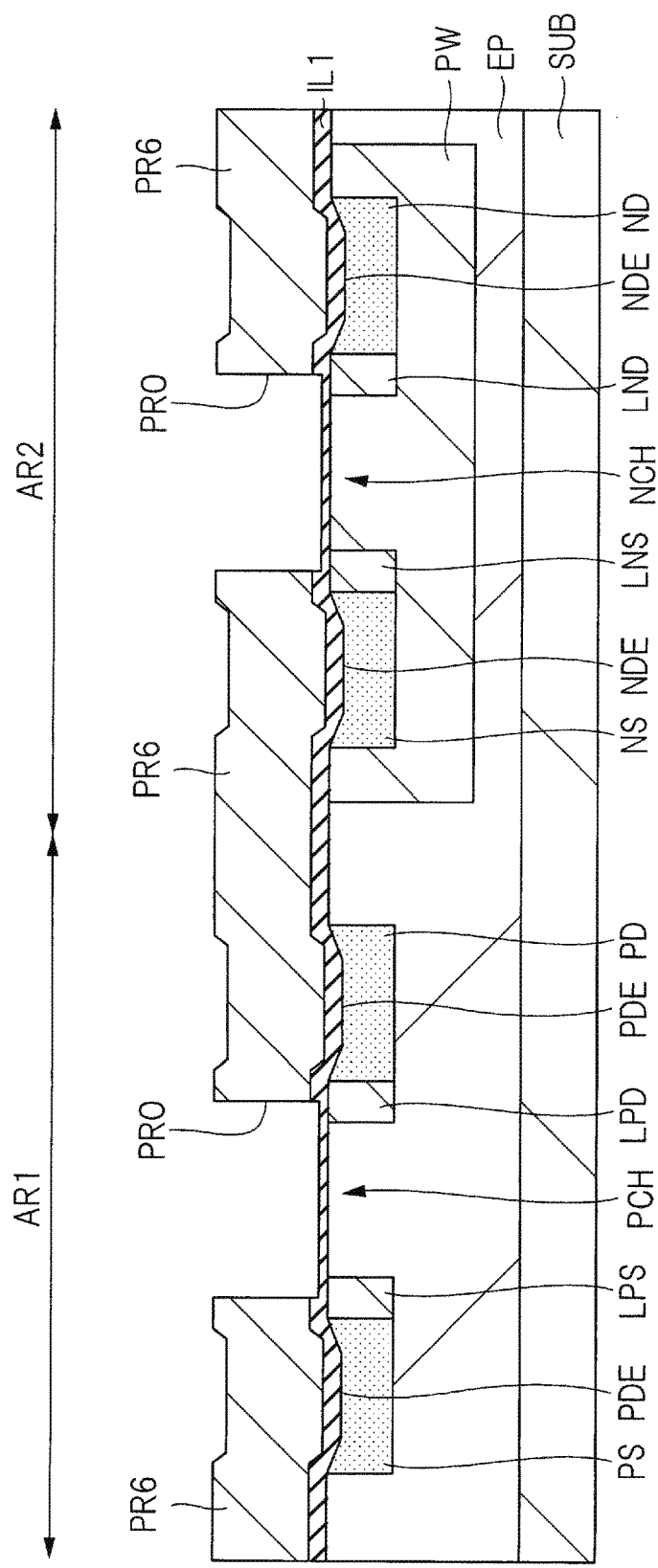
FIG. 11 is a cross sectional view of the main components in the fabrication processes of the semiconductor device subsequent to FIG. 10.

Subsequently, as shown in FIG. 10, above the channel regions PCH and NCH, a photoresist pattern PR6 is formed on the insulating film IL1. Subsequently, as shown in FIG. 11, on the photoresist pattern PR6, openings PRO are provided, the photoresist pattern PR6 formed with the openings PRO is used as a mask, and the insulating film IL1 is etched by anisotropic etching to decrease the thickness of the insulating film IL1 on the channel regions PCH and NCH. In the etching, the thickness of the insulating film IL1 partially placed over the p$^+$ source region LPS, the p$^+$ drain region LPD, the n$^+$ source region LNS, and the n$^+$ drain region LND is decreased in a planar view.

Figure 12:
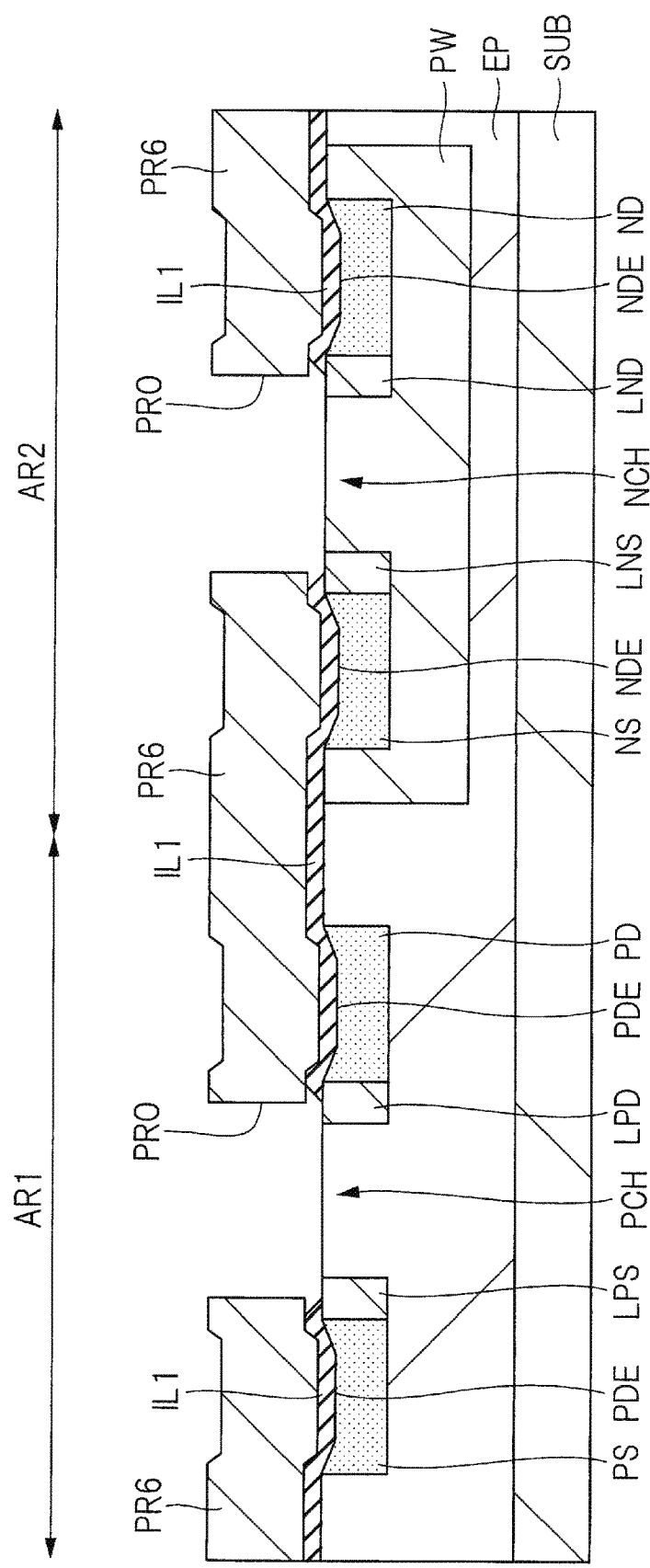
FIG. 12 is a cross sectional view of the main components in the fabrication processes of the semiconductor device subsequent to FIG. 11.

Subsequently, as shown in FIG. 12, the photoresist pattern PR6 is used as a mask, the insulating film IL1 is etched by isotropic etching, and the insulating film IL1 on the channel regions PCH and NCH is removed. Thus, the top surfaces of the channel regions PCH and NCH are exposed. After that, the photoresist pattern PR6 is removed.

Figure 13:
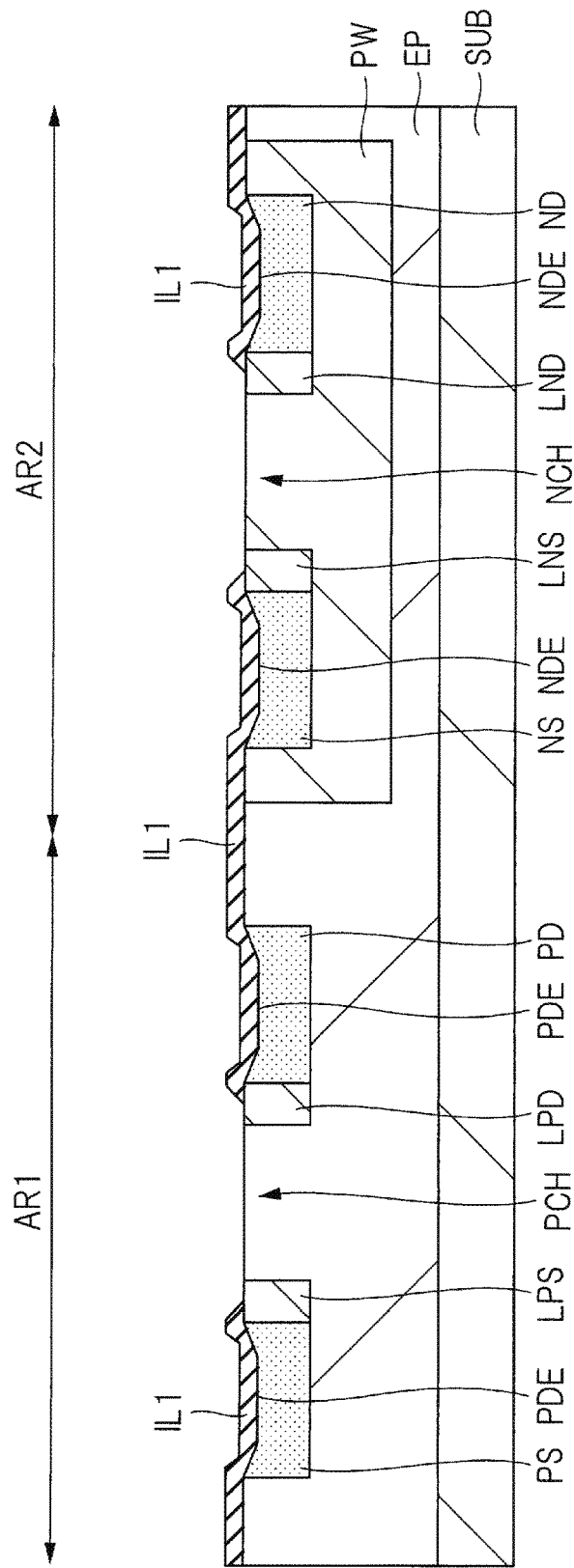
FIG. 13 is a cross sectional view of the main components in the fabrication processes of the semiconductor device subsequent to FIG. 12.

Here, as shown in FIG. 13, the insulating film IL1 below the end portion of the photoresist pattern PR6 is isotropically etched due to isotropic etching, and hence the end portions of the insulating film IL1 have a structure with the inclined surface where the thickness of the insulating film IL1 is reduced from the p$^+$ source region LPS or the p$^+$ drain region LPD toward the channel region PCH. Similarly, the end portions of the insulating film IL1 have a structure with the inclined surface where the thickness of the insulating film IL1 is reduced from the n$^+$ source region LNS or the n$^+$ drain region LND to the channel region NCH. An angle formed by the inclined surface of the end portion of the insulating film IL1 and the under surface of the insulating film IL1 (the top surface of the n$^-$ epitaxial layer EP) is 45° or more and less than 90° (see FIG. 2).

Note that in the case in which only isotropic etching is performed using the photoresist pattern PR6 as a mask without anisotropic etching, the angle of the inclined surface at the end portion of the insulating film IL1 is theoretically 45°.

However, anisotropic etching is performed in advance and then isotropic etching is performed as in the embodiment, and this enables the control of the angle of the inclined surface at the end portion of the insulating film IL1 in the range of 45° or more and less than 90°. That is, in the case in which most of the insulating film IL1 is removed by anisotropic etching, the angle of the inclined surface is close to 90°, whereas in the case in which most of the insulating film IL1 is removed by isotropic etching, the angle of the inclined surface is close to 45°.

The thickness of the insulating film IL1 on the channel regions PCH and NCH may be decreased by taper-etching the insulating film IL1, instead of anisotropic etching. In this case, an inclined surface having an angle of 45° or less can be formed at the end portion of the insulating film IL1 by taper etching. After that, the angle of the inclined surface at the end portion of the insulating film IL1 can be 45° or less by isotropic etching.

Figure 14:
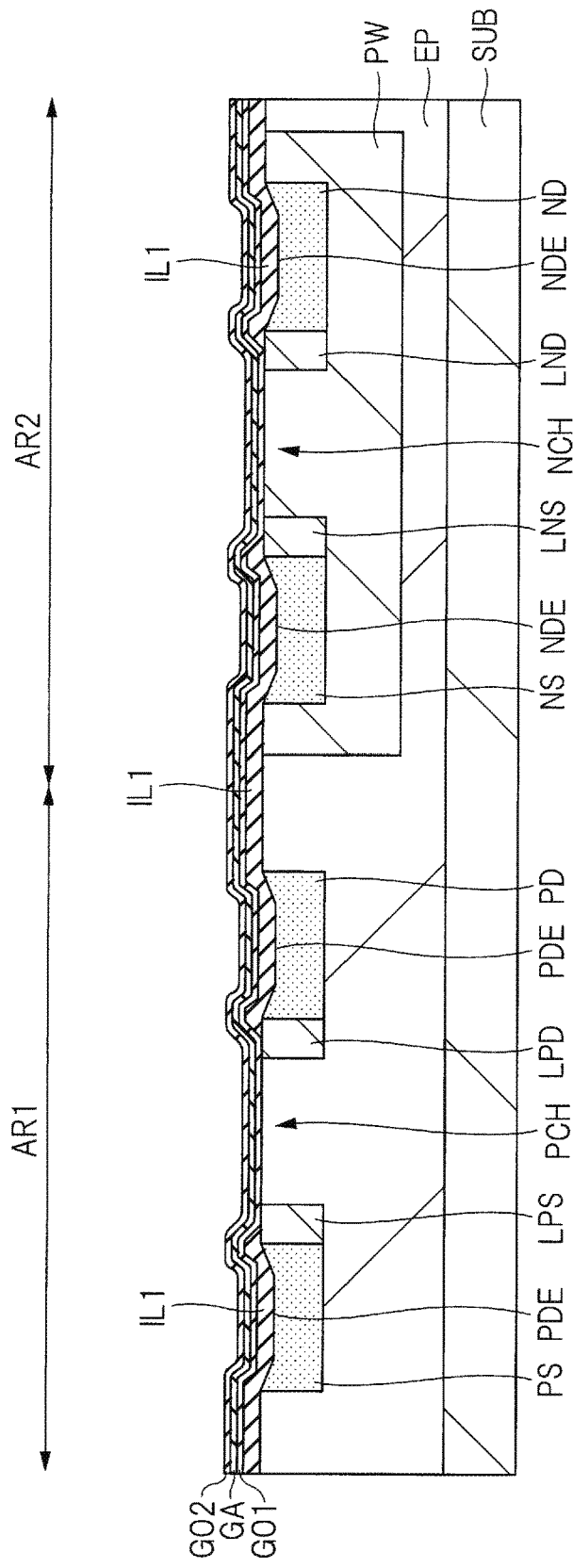
FIG. 14 is a cross sectional view of the main components in the fabrication processes of the semiconductor device subsequent to FIG. 13.

Subsequently, as shown in FIG. 14, the insulating film GO1 is formed on the channel regions NCH and PCH and the insulating film IL1. The insulating film GO1 is made of silicon oxide ($SiO_2$) or silicon oxynitride (SiON), for example. The film GO1 is preferably formed by CVD, for example.

Subsequently, as shown in FIG. 14, the insulating film GA is formed on the insulating film GO1. The insulating film GA is formed of an aluminum oxide film. The film GA can be formed by atomic layer deposition (ALD) or CVD, for example.

Subsequently, as shown in FIG. 14, the insulating film GO2 is formed on the insulating film GA. The insulating film GO2 is made of silicon oxide ($SiO_2$) or silicon oxynitride (SiON), for example. The film GO2 is preferably formed by CVD, for example.

Figure 15:
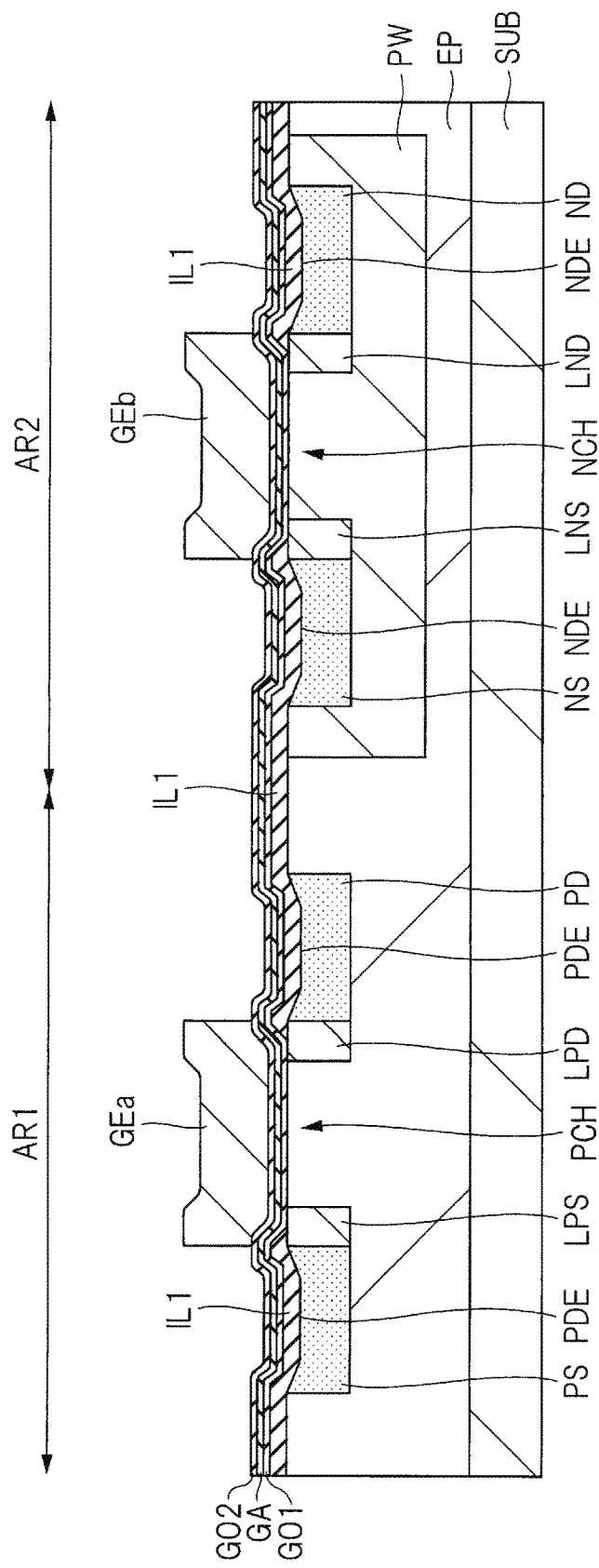
FIG. 15 is a cross sectional view of the main components in the fabrication processes of the semiconductor device subsequent to FIG. 14.

Subsequently, although not shown in the drawing, a polysilicon (Si) film is formed on the insulating film GO2. A photoresist pattern (not shown) is used as a mask, p-type impurity ions (e.g. boron (B) ions) are implanted into the polysilicon film in the p well region PW (the polysilicon film corresponds to a gate electrode GEb, described later), and then the photoresist pattern is removed. Subsequently, a photoresist pattern (not shown) is used as a mask, n-type impurity ions (e.g. phosphorus (P) ions) are implanted into the polysilicon film in the regions other than the p well region PW (the polysilicon film corresponds to a gate electrode GEa, described later), and then the photoresist pattern is removed. After the implantation of these ions, a photoresist pattern (not shown) is used as a mask, the polysilicon film is processed by dry etching, and then the gate electrodes GEa and GEb are formed as shown in FIG. 15. The thicknesses of the gate electrodes GEa and GEb range from approximately 0.1 to 0.5 μm, for example. After that, the photoresist pattern is removed.

Figure 16:
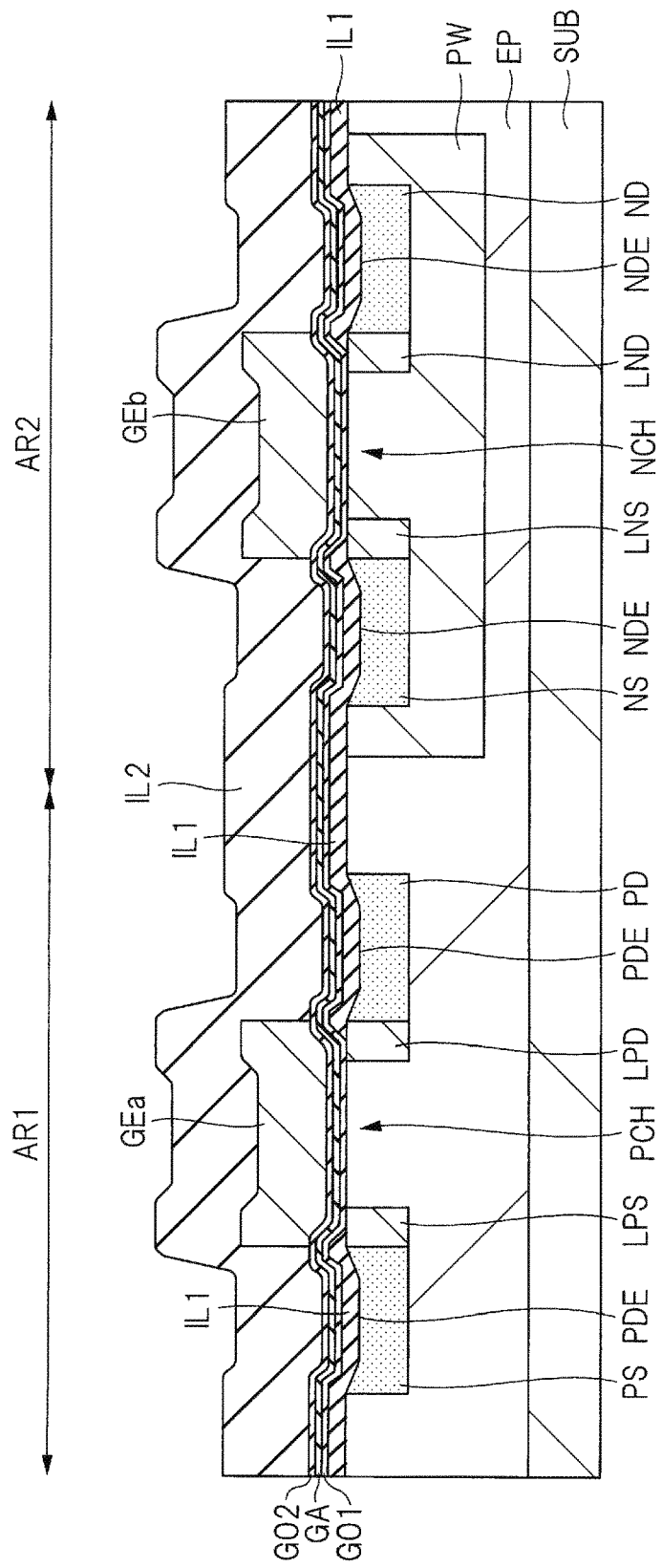
FIG. 16 is a cross sectional view of the main components in the fabrication processes of the semiconductor device subsequent to FIG. 15.

Subsequently, as shown in FIG. 16, the insulating film IL2 is formed on the insulating film GO2 so as to cover the gate electrodes GEa and GEb. The insulating film IL2 is made of silicon oxide, for example. The film IL2 is preferably formed by CVD, for example.

Figure 17:
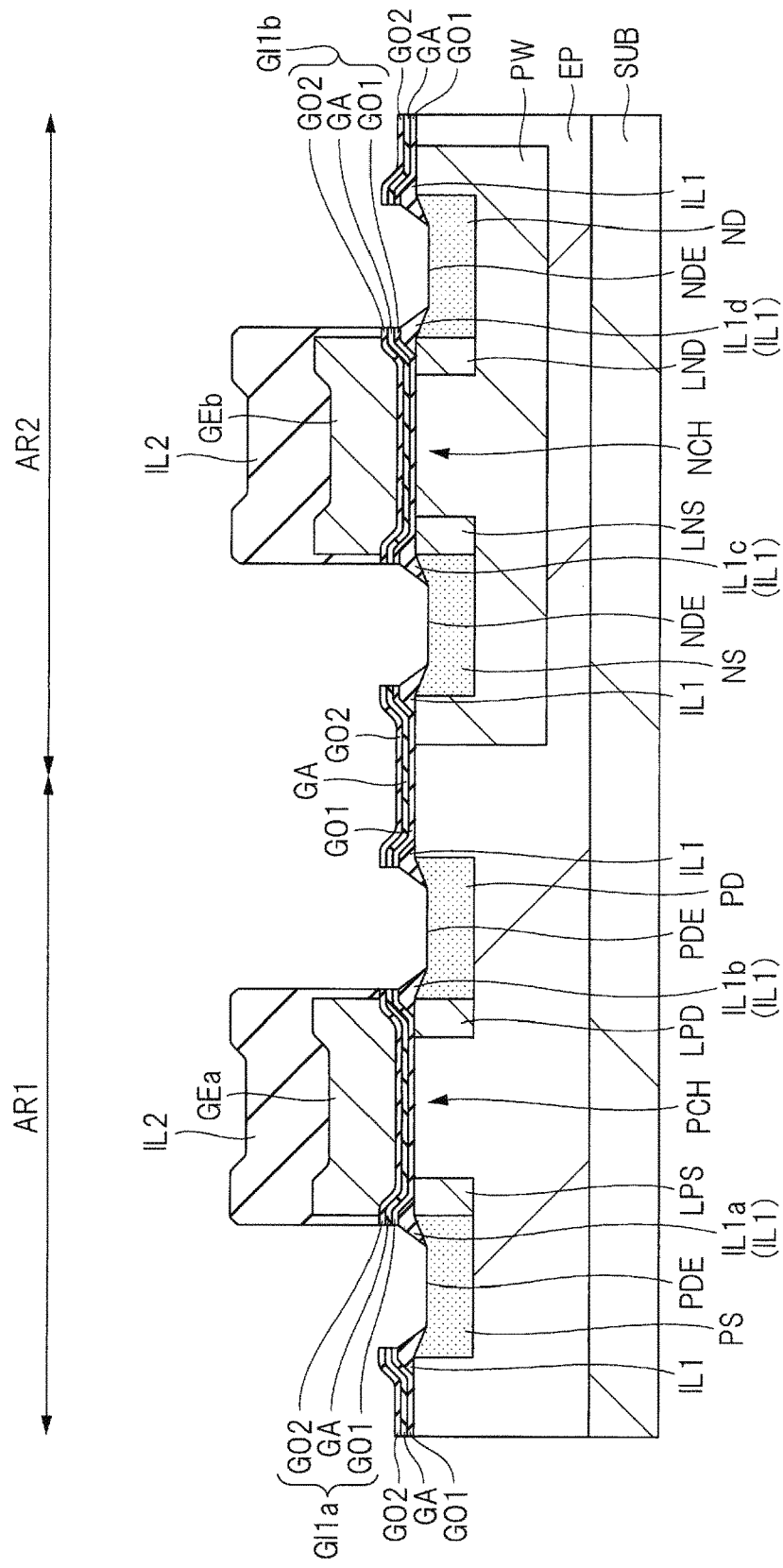
FIG. 17 is a cross sectional view of the main components in the fabrication processes of the semiconductor device subsequent to FIG. 16.

Subsequently, as shown in FIG. 17, a photoresist pattern (not shown) is used as a mask, the insulating films IL2, GO1, GA, GO2, and IL1 are processed by dry etching. Thus, the insulating films IL1a, IL1b, IL1c, and IL1d are formed, and the $p^{++}$ source region PS, the $p^{++}$ drain region PD, the $n^{++}$ source region NS, and the $n^{++}$ drain region ND are exposed.

Here, a gate insulating film GI1a is formed of the insulating film GO1 on the channel region PCH and the insulating films IL1a and IL1b, the insulating film GA on the insulating film GO1, and the insulating film GO2 on the insulating film GA. A gate insulating film GI1b is formed of the insulating film GO1 on the channel region NCH and the insulating films IL1c and IL1d, the insulating film GA on the insulating film GO1, and the insulating film GO2 on the insulating film GA. The film thicknesses of the gate insulating films GI1a and GI1b (the total film thickness of the thicknesses of the insulating films GO1, Ga, and GO2) range from approximately 0.01 to 0.1 μm, for example.

As shown in FIG. 17, after etching the insulating films IL2, GO1, Ga, and GO2, the insulating film IL1 is taper-etched. Thus, an inclined surface having an angle of 45° or less is formed at the end portion of the insulating film IL1a on the $p^{++}$ source region PS side, the end portion of the insulating film IL1b on the $p^{++}$ drain region PD side, the end portion of the insulating film IL1c on the $n^{++}$ source region NS side, and the end portion of the insulating film IL1d on the $n^{++}$ drain region ND side.

Note that as shown in FIG. 17, in dry etching the insulating films IL2, GO1, GA, GO2, and IL1, the insulating films IL1, GO1, GA, and GO2 are left as field insulating films on the $n^−$ epitaxial layer EP where the p-channel and the n-channel MOSFETs are not formed (partially including the surfaces on the $p^{++}$ source region PS, the $p^{++}$ drain region PD, the p well region PW, the $n^{++}$ source region NS, and the $n^{++}$ drain region ND.

Subsequently, as shown in FIG. 1, a metal film is deposited on the $p^{++}$ source region PS and the insulating film IL2 to process the metal film, and the source wiring electrode M1a is formed. A metal film is deposited on the $p^{++}$ drain region PD and the insulating film IL2 to process the metal film, and the drain wiring electrode M1b is formed. The source wiring electrode M1c is formed on the $n^{++}$ source region NS and the insulating film IL2. The drain wiring electrode M1d is formed on the $n^{++}$ drain region ND and the insulating film IL2. The metal film is preferably a film stack formed by in turn depositing a titanium (Ti) film, a titanium nitride (TiN) film, and an aluminum (Al) film.

After that, external wires are individually electrically connected to the source wiring electrodes M1a and M1c, the drain wiring electrodes M1b and MID, and the gate wiring electrodes (not shown), and then the p-channel and the n-channel MOSFETs are completed.

Overview of the Investigation
Case Study Example 1

Figure 18:
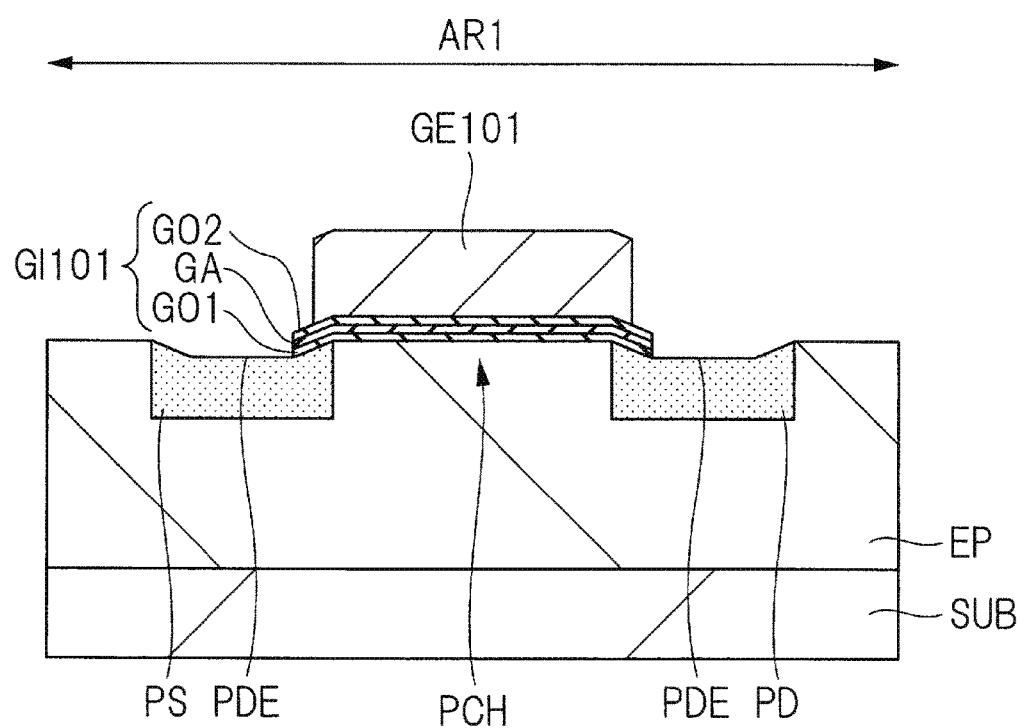
FIG. 18 is a cross sectional view of the main components of a semiconductor device of Case study example 1.

In the following, a semiconductor device of Case study example 1 investigated by the present inventors will be described. FIG. 18 is a cross sectional view of the main components of a semiconductor device of Case study example 1 investigated by the present inventors. Similarly to the embodiment, in the semiconductor device of Case study example 1, a p-channel MOSFET and an n-channel MOSFET are formed in different flat regions of the same principal surface of a SiC substrate SUB. However, in FIG. 18, in the regions corresponding to FIG. 1, only the structure of the p-channel MOSFET formed in the region AR1 is shown, and the structure of the n-channel MOSFET formed in the region AR2 is omitted for simplifying the description.

The semiconductor device of Case study example 1 shown in FIG. 18 has an $n^+$ SiC substrate SUB, an $n^−$ epitaxial layer EP formed on the $n^+$ SiC substrate SUB, and a $p^{++}$ source region PS and a $p^{++}$ drain region PD formed in the $n^−$ epitaxial layer EP, similar to the semiconductor device according to the embodiment. That is, the $p^{++}$ source region PS and the $p^{++}$ drain region PD are doped with an impurity at a concentration of $5 \times 10^{20}$ $cm^{-3}$ to $5 \times 10^{21}$ $cm^{-3}$.

On the other hand, as shown in FIG. 18, the semiconductor device of Case study example 1 is not formed with the $p^+$ source region LPS having an impurity concentration lower than the impurity concentration of the $p^{++}$ source region PS and the $p^+$ drain region LPD having an impurity concentration lower than the impurity concentration of the $p^{++}$ drain region PD. That is, in the semiconductor device of Case study example 1, the region between the $p^{++}$ source region PS and the $p^{++}$ drain region PD in the $n^-$ epitaxial layer EP functions as a channel region PCH.

On the channel region PCH, the $p^{++}$ source region PS, and the $p^{++}$ drain region PD, a gate insulating film GI101 is formed. Note that in the semiconductor device of Case study example 1, no insulating films IL1a and IL1b are formed on the $n^-$ epitaxial layer EP. That is, the end portions of the gate insulating film GI101 is directly in contact with the $p^{++}$ source region PS and the $p^{++}$ drain region PD.

On the gate insulating film GI101, a gate electrode GE101 is formed. The gate electrode GE101 is placed over the channel region PCH, the $p^{++}$ source region PS, and the $p^{++}$ drain region PD in a planar view.

Similarly to the embodiment, in Case study example 1, since the $p^{++}$ source region PS and the $p^{++}$ drain region PD have high impurity concentrations, the crystallizability of the regions PS and PD is reduced, resulting in a distorted structure. Thus, a recess PDE is formed in the $p^{++}$ source region PS and the $p^{++}$ drain region PD. As a result, the end portion of the gate insulating film GI101 on the $p^{++}$ source region PS side is disposed along an inclined surface from the $p^{++}$ source region LPS toward the recess PDE. Similarly, the end portion of the gate insulating film GI101 on the $p^{++}$ drain region PD side is disposed along an inclined surface from the $p^{++}$ drain region PD toward the recess PDE.

Therefore, the distance between the under surface of the gate electrode GE101 (the surface in contact with the gate insulating film GI101) and the top surface of the $p^{++}$ source region PS (the top surface of the $n^-$ epitaxial layer EP) is constant from the channel region PCH to the $p^{++}$ source region PS in the channel length direction (the under surface is apart from the top surface by the thickness of the gate insulating film GI101). Similarly, the distance between the under surface of the gate electrode GE101 (the surface in contact with the gate insulating film GI101) and the top surface of the $p^{++}$ drain region PD (the top surface of the $n^-$ epitaxial layer EP) is constant from the channel region PCH to almost the center of the $p^{++}$ drain region PD in the channel length direction (the under surface is apart from the top surface by the thickness of the gate insulating film GI101).

Here, problems of Case study example 1 that are found by the present inventors will be described.

The present inventors investigate semiconductor devices having an n-channel MOSFET and a p-channel MOSFET formed on a SiC substrate. In the case in which an n-channel MOSFET and a p-channel MOSFET are formed on a SiC substrate like the semiconductor device of Case study example 1, when the absolute value of a threshold voltage is too large for the design film thickness of the gate insulating film of the MOSFET (the gate insulating film GI101 in FIG. 18), the electric field strength in the gate insulating film is increased. An increase in the electric field strength in the gate insulating film decreases the life of the semiconductor device. Specifically under high temperature environments, a leakage current from the SiC substrate to the gate electrode is noticeable. The leakage current is caused by thermal field emission. When the absolute value of the threshold voltage of the n-channel MOSFET is different from the absolute value of the threshold voltage of the p-channel MOSFET, the degree of freedom of design of semiconductor devices is reduced. Thus, the n-channel and the p-channel MOSFETs present in the same circuit are desired to have an appropriate threshold voltage in the same size.

Typically, the threshold voltage of the MOSFET depends on the difference between the work functions of the gate electrode and the semiconductor substrate, the bulk potential in the semiconductor substrate, the dielectric constant of the semiconductor substrate, the impurity concentration of the channel region, and effective fixed charges present in the gate insulating films, for example. Here, as a result of the investigation by the present inventors, it is found that effective fixed charges present in the gate insulating film of the n-channel MOSFET are different from effective fixed charges present in the gate insulating film of the p-channel MOSFET.

Specifically, in the n-channel MOSFET, a p-type impurity doped in the channel region (the channel region NCH in FIG. 1, i.e. the p well region PW) for providing conductivity is diffused in the gate insulating film, and the impurity is ionized in the gate insulating film. Thus, the n-channel MOSFET has positive fixed charges present near the interface between the channel region and the gate insulating film, and the absolute value of the threshold voltage is reduced. However, in the p-channel MOSFET, an impurity doped in the channel region (the channel region PCH in FIG. 1, i.e. the $n^-$ epitaxial layer EP) is not easily diffused in the gate insulating film. Thus, the p-channel MOSFET has no negative fixed charges, and the absolute value of the threshold voltage is not reduced.

Therefore, it is revealed that in the n-channel MOSFET, since the contribution of fixed charges is great, a desired threshold voltage can be obtained by simply changing a typical design value, whereas in the p-channel MOSFET, since the contribution of fixed charges is small, no small threshold voltage is obtainable, even though the impurity concentration of the channel region is decreased, for example. As described above, it is desired that the absolute value of the threshold voltage of the p-channel MOSFET be reduced to provide a threshold voltage the same as the threshold voltage of the n-channel MOSFET.

Thus, as shown in FIG. 18, in the semiconductor device of Case study example 1, an aluminum oxide film is introduced into the gate insulating film GI101. Since the aluminum oxide film acts as negative fixed charges, the introduction of the aluminum oxide film into the gate insulating film enables a reduction in the absolute value of the threshold voltage of the p-channel MOSFET.

Note that in Case study example 1, as shown in FIG. 18, the gate insulating film GI101 is a film stack composed of the insulating film GA formed of the aluminum oxide film and the insulating films GO1 and GO2 that are composed of silicon oxide films sandwiching the insulating film GA. However, the similar effect is exerted by forming the entire gate insulating film with an aluminum oxide film.

Here, in the case in which an aluminum oxide film is introduced into the gate insulating film GI101, aluminum oxide is deposited in an amorphous state. The impurity taken in the process of deposition can be removed by annealing after the gate insulating film is formed. However, when amorphous aluminum oxide is annealed at a temperature of approximately 900° C. or more, the aluminum oxide is crystallized. The crystallization of the aluminum oxide causes a problem of an increase in a leakage current from the SiC substrate to the gate electrode through the grain boundary of the aluminum oxide formed in the gate insulating film. Therefore, in the case in which an aluminum oxide film is introduced into the gate insulating film, in the fabrication processes of the MOSFET, the process of high temperature annealing after forming the gate insulating film has to be avoided, or the process of high temperature annealing after forming the gate insulating film has to be changed to the process of low temperature annealing after forming the gate insulating film.

First, an example of the high temperature annealing processes that has to be performed after forming the gate insulating film includes the process of forming a metal silicide layer. The metal silicide layer is formed of a nickel silicide layer or a titanium silicide layer, for example. The metal silicide layer is formed by depositing a metal, such as nickel or titanium, is deposited on the surface of the semiconductor region to anneal the metal at a high temperature of 1,000° C. or more. The metal silicide layer is formed to provide excellent electrical contact between the source region or the drain region and the source wiring electrode or the drain wiring electrode. In order to avoid the process of forming this metal silicide layer, it is considered that the source region and the drain region are doped with a high concentration impurity to decrease the resistivity. Therefore, in Case study example 1, an impurity at a concentration of $5 \times 10^{20}$ cm$^{-3}$ to $5 \times 10^{21}$ cm$^{-3}$ is doped in the p$^{++}$ source region PS and the p$^{++}$ drain region PD. This enables the achievement of an ohmic contact between the p$^{++}$ source region PS and the source wiring electrode M1$a$ and between the p$^{++}$ drain region PD and the drain wiring electrode M1$b$. Although not shown in the drawing, similarly, an impurity at a concentration of $5 \times 10^{20}$ cm$^{-3}$ to $5 \times 10^{21}$ cm$^{-3}$ is doped in the n$^{++}$ source region and the n$^{++}$ drain region. This enables the achievement of an ohmic contact between the n$^{++}$ source region and the source wiring electrode and between the n$^{++}$ drain region and the drain wiring electrode. In Case study example 1, this enables avoidance of the process of forming a metal silicide layer that needs high temperature annealing.

However, in Case study example 1, the gate electrode GE101 is placed over the p$^{++}$ source region PS and the p$^{++}$ drain region PD in a planar view. The distance between the under surface of the gate electrode GE101 and the top surface of the p$^{++}$ source region PS is constant from the channel region PCH to the p$^{++}$ source region PS in the channel length direction (the under surface is apart from the top surface by the thickness of the gate insulating film GI101). Similarly, the distance between the under surface of the gate electrode GE101 and the top surface of the p$^{++}$ drain region PD is constant from the channel region PCH to almost the center of the p$^{++}$ drain region PD in the channel length direction (the under surface is apart from the top surface by the thickness of the gate insulating film GI101). Thus, a problem arises that electric fields are concentrated on the end portions of the gate electrode GE101 and leakage currents from the SiC substrate SUB to the gate electrode GE101 are noticeable. Specifically, in Case study example 1, a problem arises that since the p$^{++}$ source region PS and the p$^{++}$ drain region PD include a high concentration impurity, leakage currents from the p$^{++}$ source region PS and the p$^{++}$ drain region PD to the gate electrode GE101 more noticeably occur.

As described above, in Case study example 1, a recess PDE is formed in the p$^{++}$ source region PS and the p$^{++}$ drain region PD by doping the p$^{++}$ source region PS and the p$^{++}$ drain region PD with a high concentration impurity. Although not shown in FIG. 18, the surfaces of the p$^{++}$ source region PS and the p$^{++}$ drain region PD are rougher than the surfaces of the other regions because of the doped high concentration impurity. Thus, in some places, the p$^{++}$ source region PS and the p$^{++}$ drain region PD are in point contact with the gate insulating film GI101 formed on the p$^{++}$ source region PS and the p$^{++}$ drain region PD, not in surface contact. Similarly, in some places, the gate insulating film GI101 is in point contact with the gate electrode GE101 formed on the gate insulating film GI101, not in surface contact. Thus, electric field concentrations easily occur at the end portions of the gate electrode GE101 disposed on the p$^{++}$ source region PS and the p$^{++}$ drain region PD, also resulting in a problem that leakage currents from the p$^{++}$ source region PS and the p$^{++}$ drain region PD to the gate electrode GE101 more noticeably occur. The gate leakage currents as described above degrade the reliability of semiconductor devices.

An example of one of the processes that solve the problems above includes the process of light oxidation. Light oxidation means the process in which the end portions of the gate electrode made of polysilicon are formed in a round shape by heating to form a dense oxide film on the gate electrode. The gate electrode is provided with round end portions, and hence this enables the relaxation of electric field concentrations occurring at the end portions of the gate electrode. In the case in which a MOSFET is formed on the SiC substrate, light oxidation has to be performed at a high temperature of approximately 1,000° C. Thus, Case study example 1 fails to perform the process of light oxidation, and fails to solve the problems.

Case Study Example 2

Figure 19:
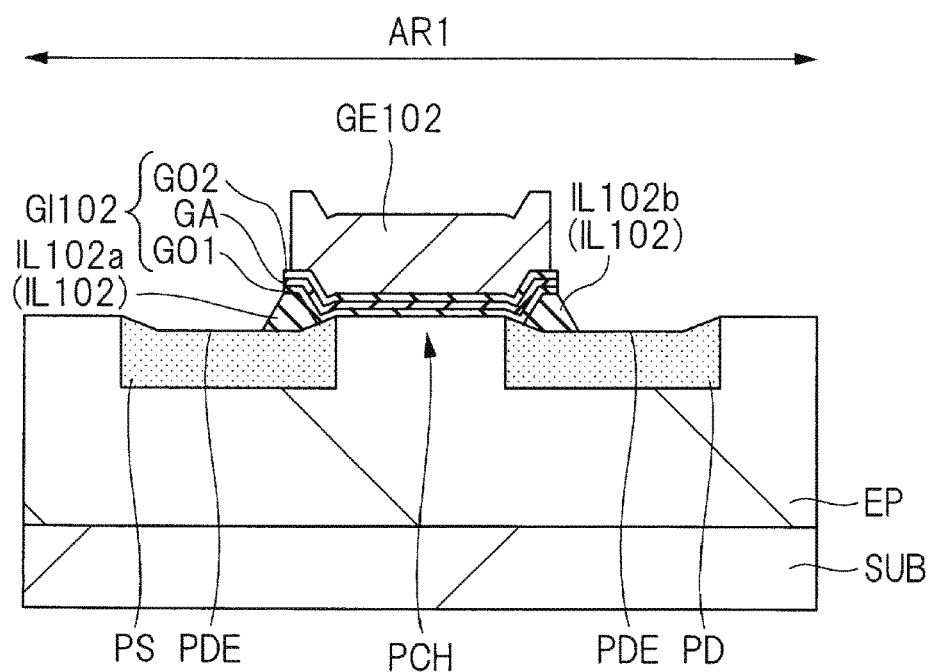
FIG. 19 is a cross sectional view of the main components of a semiconductor device of Case study example 2.

Next, a semiconductor device of Case study example 2 investigated by the present inventors will be described. FIG. 19 is a cross sectional view of the main components of a semiconductor device of Case study example 2 investigated by the present inventors. Similarly to the embodiment and Case study example 1, in the semiconductor device of Case study example 2, a p-channel MOSFET and an n-channel MOSFET are formed in different flat regions of the same principal surface of a SiC substrate SUB. However, in FIG. 19, in the regions corresponding to FIG. 1, only the structure of the p-channel MOSFET formed in the region AR1 is shown, and the structure of the n-channel MOSFET formed in the region AR2 is omitted for simplifying the description.

The semiconductor device of Case study example 2 shown in FIG. 19 has an n$^+$ SiC substrate SUB, an n$^-$ epitaxial layer EP formed on the n$^+$ SiC substrate SUB, and a p$^{++}$ source region PS and a p$^{++}$ drain region PD formed in the n$^-$ epitaxial layer EP, similar to the semiconductor devices of the embodiment and Case study example 1. That is, the p$^{++}$ source region PS and the p$^{++}$ drain region PD are doped with an impurity at a concentration of $5 \times 10^{20}$ cm$^{-3}$ to $5 \times 10^{21}$ cm$^{-3}$.

As shown in FIG. 19, the semiconductor device of Case study example 2 is not formed with the p$^+$ source region LPS having an impurity concentration lower than the impurity concentration of the p$^{++}$ source region PS and the p$^+$ drain region LPD having an impurity concentration lower than the impurity concentration of the p$^{++}$ drain region PD, similarly to Case study example 1. That is, in the semiconductor device of Case study example 2, the region between the p$^{++}$ source region PS and the p$^{++}$ drain region PD in the n$^-$ epitaxial layer EP functions as a channel region PCH.

Similarly to the embodiment and Case study example 1, in Case study example 2, since the p$^{++}$ source region PS and the p$^{++}$ drain region PD have high impurity concentrations, the crystallizability of the regions PS and PD is reduced, resulting in a distorted structure. Thus, a recess PDE is formed in the p$^{++}$ source region PS and the p$^{++}$ drain region PD.

On the n$^-$ epitaxial layer EP, insulating films IL102$a$ and IL102$b$ are formed. Specifically, the insulating film IL102$a$ is formed on the p$^{++}$ source region PS, and the insulating film IL102b is formed on the p$^{++}$ drain region PD. The insulating films IL102a and IL102b are composed of a silicon oxide film, for example.

Similarly to the embodiment, the insulating films IL102a and IL102b are formed in a nearly mountain shape. Specifically, the end portion of the insulating film IL102a on the channel region PCH side has an inclined surface where the thickness of the insulating film IL102a is reduced from the p$^{++}$ source region PS toward the channel region PCH. The end portion of the insulating film IL102a on the channel region PCH side is disposed in the p$^{++}$ source region PS. The insulating film IL102a does not cover a part of the p$^{++}$ source region PS on the channel region PCH side.

The end portion of the insulating film IL102a on the p$^{++}$ source region PS side has an inclined surface where the thickness of the insulating film IL102a is reduced from the channel region PCH toward the recess PDE of the p$^{++}$ source region PS.

The end portion of the insulating film IL102b on the channel region PCH side has an inclined surface where the thickness of the insulating film IL102b is reduced from the p$^{++}$ drain region PD toward the channel region PCH. In a planar view, the end portion of the insulating film IL102b on the channel region PCH side is disposed in the p$^{++}$ drain region PD, and the insulating film IL102b does not cover a part of the p$^{++}$ drain region PD on the channel region PCH side.

The end portion of the insulating film IL102b on the p$^{++}$ drain region PD side has an inclined surface where the thickness of the insulating film IL102b is reduced from the channel region PCH toward the recess PDE of the p$^{++}$ drain region PD.

On the channel region PCH, the p$^{++}$ source region PS, the p$^{++}$ drain region PD, and the insulating films IL102a and IL102b, a gate insulating film GI102 is formed. The gate insulating film GI102 is in contact with the channel region PCH, the p$^{++}$ source region PS that is not covered with the insulating film IL102a, and the p$^{++}$ drain region PD that is not covered with the insulating film IL102b. The gate insulating film GI102 is placed over the p$^{++}$ source region PS and the p$^{++}$ drain region PD in a planar view.

In the semiconductor device of Case study example 2, on the n$^-$ epitaxial layer EP, the insulating films IL102a and IL102b are formed. The end portions of the gate insulating film GI102 are individually placed on the insulating films IL102a and IL102b. Thus, the end portions of the gate insulating film GI102 are not in contact with the p$^{++}$ source region PS and the p$^{++}$ drain region PD.

On the gate insulating film GI102, a gate electrode GE102 is formed. The gate electrode GE102 also has a cross sectional form similar to the gate insulating film GI102. The gate electrode GE102 is placed over the channel region PCH, the p$^{++}$ source region PS, and the p$^{++}$ drain region PD in a planar view.

Note that the insulating films IL102a and IL102b of Case study example 2 can be formed by the processes similar to the embodiment. That is, the insulating films IL102a and IL102b can be formed by a method with which after forming the p$^{++}$ source region PS and the p$^{++}$ drain region PD, the insulating film IL102 is formed on the top surface of the n$^-$ epitaxial layer EP, and then the insulating film IL102 is etched by anisotropic etching and isotropic etching using a resist pattern formed with openings as a mask.

Here, problems of Case study example 2 that are found by the present inventors will be described.

In Case study example 2, instead of avoiding the process of light oxidation, the process of forming the insulating films IL102a and IL102b is provided. That is, in the semiconductor device of Case study example 2, the insulating films IL102a and IL102b are formed on the n$^-$ epitaxial layer EP, and the end portions of the gate insulating film GI102 are individually placed on the insulating films IL102a and IL102b. This structure enables the relaxation of electric field concentrations occurring at the end portions of the gate electrode GE102.

However, in Case study example 2, other problems occur. Similarly to the embodiment and Case study example 1, in Case study example 2, since the impurity concentrations of the p$^{++}$ source region PS and the p$^{++}$ drain region PD are high, a recess PDE is formed in the p$^{++}$ source region PS and the p$^{++}$ drain region PD. Thus, the portion of the p$^{++}$ source region PS that is not covered with the insulating film IL102a is inclined downward from the channel region PCH toward the p$^{++}$ source region PS. On the other hand, the end portion of the insulating film IL102a on the channel region PCH side is inclined upward from the channel region PCH toward the p$^{++}$ source region PS. As a result, the gate insulating film GI102 has a cross sectional form that is once inclined downward from the channel region PCH toward the p$^{++}$ source region PS and then inclined upward in the channel length direction. Thus, the gate electrode GE102 on the gate insulating film GI102 also has a similar cross sectional form. In this case, the distortion of the gate electrode GE102 is large, and electric field concentrations occur in this region. As a result, a problem arises that leakage currents from the p$^{++}$ source region PS and the p$^{++}$ drain region PD to the gate electrode GE102 more noticeably occur.

Note that here, it is considered that in order to decrease the distortion of the gate electrode GE102, the end portions of the insulating films IL102a and IL102b on the channel region PCH side are disposed on the channel region PCH. Thus, since the gate insulating film GI102 is not in contact with the p$^{++}$ source region PS and the p$^{++}$ drain region PD, the distortion of the cross sectional forms of the gate insulating film GI102 and the gate electrode GE102 is decreased. However, since the end portions of the insulating films IL102a and IL102b on the channel region PCH side are disposed on the channel region PCH, a contact area of the gate insulating film GI102 with the channel region PCH is insufficiently provided, and this might cause a degraded performance of the semiconductor device.

As described above, there are desired a semiconductor device that enables a reduction in leakage currents from the source region and the drain region to the gate electrode occurring in Case study examples 1 and 2 while avoiding the process of forming the metal silicide layer and the process of light oxidation and a method of manufacturing the semiconductor device.

Main Features and Effects

As shown in FIG. 1, in the main features of the embodiment, the insulating film GA formed of an aluminum oxide film is included in the gate insulating film GI1a in the p-channel MOSFET formed in the region AR1. The p$^{++}$ source region PS and the p$^{++}$ drain region PD having a high impurity concentration of $5 \times 10^{20}$ cm$^{-3}$ or more are formed in the n$^-$ epitaxial layer EP. In the n$^-$ epitaxial layer EP, the p$^+$ source region (the low concentration source region) LPS having an impurity concentration of $1 \times 10^{20}$ cm$^{-3}$ or less is formed at the end portion of the p$^{++}$ source region PS on the p$^{++}$ drain region PD side. In the n$^-$ epitaxial layer EP, the p$^+$ drain region (the low concentration drain region) LPD having an impurity concentration of $1 \times 10^{20}$ cm$^{-3}$ or less is formed at the end portion of the p$^{++}$ drain region PD on the p$^{++}$ source region PS side. The insulating film IL1a is formed on the p$^{++}$ source region PS and the p$^+$ source region LPS. The insulating film IL1b is formed on the p$^{++}$ drain region PD and the p$^+$ drain region LPD.

The gate insulating film GI1a is placed on the inclined surface (the first inclined surface) formed at the end portion of the insulating film IL1a on the p$^+$ source region LPS side and the inclined surface (the second inclined surface) formed at the end portion of the insulating film IL1b on the p$^+$ drain region LPD side. The end portions of the gate insulating film GI1a are individually disposed on the faces formed at the tops of the insulating films IL1a and IL1b in parallel with the top surface of the n$^-$ epitaxial layer EP. The gate electrode GEa formed on the gate insulating film GI1a has a cross sectional form similar to the gate insulating film GI1a. That is, the gate electrode GEa is placed on the inclined surface (the first inclined surface) formed at the end portion of the insulating film IL1a on the p$^+$ source region LPS side and the inclined surface (the second inclined surface) formed at the end portion of the insulating film IL1b on the p$^+$ drain region LPD side through the gate insulating film GI1a.

In the n-channel MOSFET formed in the region AR2, the gate insulating film GI1b includes the insulating film GA formed of an aluminum oxide film. The n$^{++}$ source region NS and the n$^{++}$ drain region ND having a high impurity concentration of $5\times10^{20}$ cm$^{-3}$ or more are formed in the p well region PW. In the p well region PW, the n$^+$ source region (the low concentration source region) LNS having an impurity concentration of $1\times10^{20}$ cm$^{-3}$ or less is formed at the end portion of the n$^{++}$ source region NS on the n$^{++}$ drain region ND side. In the p well region PW, the n$^+$ drain region (the low concentration drain region) LND having an impurity concentration of $1\times10^{20}$ cm$^{-3}$ or less is formed at the end portion of the n$^{++}$ drain region ND on the n$^{++}$ source region NS side. The insulating film IL1c is formed on the n$^{++}$ source region NS and the n$^+$ source region LNS. The insulating film IL1d is formed on the n$^{++}$ drain region ND and the n$^+$ drain region LND.

The gate insulating film GI1b is placed on the inclined surface (the third inclined surface) formed at the end portion of the insulating film IL1c on the n$^+$ source region LNS side and the inclined surface (the fourth inclined surface) formed at the end portion of the insulating film IL1d on the n$^+$ drain region LND side. The end portions of the gate insulating film GI1b are individually disposed on the faces formed at the tops of the insulating films IL1c and IL1d in parallel with the top surface of the p well region PW (the n$^-$ epitaxial layer EP). The gate electrode GEb formed on the gate insulating film GI1b has a cross sectional form similar to the gate insulating film GI1b. That is, the gate electrode GEb is placed on the inclined surface (the third inclined surface) formed at the end portion of the insulating film IL1c on the n$^+$ source region LNS side and the inclined surface (the fourth inclined surface) formed at the end portion of the insulating film IL1d on the n$^+$ drain region LND side through the gate insulating film GI1b.

In the embodiment, the structures described above are adopted, and hence the improvement of reliability of semiconductor devices is enabled. In the following, the reasons will be described more in detail.

In the embodiment, the gate insulating film GI1a includes the insulating film GA formed of an aluminum oxide film, and this enables a reduction in the absolute value of the threshold voltage of the p-channel MOSFET as described above.

In the embodiment, the p$^{++}$ source region PS and the p$^{++}$ drain region PD are doped with an impurity at a concentration of $5\times10^{20}$ cm$^{-3}$ or more, and this achieves the ohmic contact between the p$^{++}$ source region PS and the source wiring electrode M1a and between the p$^{++}$ drain region PD and the drain wiring electrode M1b as described above. Similarly, the n$^{++}$ source region NS and the n$^{++}$ drain region ND are doped with an impurity at a concentration of $5\times10^{20}$ cm$^{-3}$ or more, and this achieves the ohmic contact between the n$^{++}$ source region NS and the source wiring electrode M1c and between the n$^{++}$ drain region ND and the drain wiring electrode M1d as described above. Thus, in the embodiment, although the gate insulating films GI1a and GI1b include the insulating film GA formed of an aluminum oxide film, the process of forming the metal silicide layer that needs high temperature annealing is avoided, and hence this enables the prevention of the occurrence of gate leakage currents due to the crystallization of aluminum oxide.

As shown in FIG. 1, in the embodiment, the gate electrode GEa has a structure in which the end portions are individually placed on the insulating films IL1a and IL1b through the gate insulating film GI1a. Thus, this structure enables the relaxation of electric field concentrations occurring at the end portions of the gate electrode GEa. Similarly, as shown in FIG. 2, the gate electrode GEb has a structure in which the end portions are individually placed on the insulating films IL1c and IL1d through the gate insulating film GI1b. Thus, this structure enables the relaxation of electric field concentrations occurring at the end portions of the gate electrode GEb.

As shown in FIG. 1, as described above, since the impurity concentration of the p$^+$ source region LPS is not so high, compared with the impurity concentration of the p$^{++}$ source region PS, the crystallizability of the region LPS is not reduced, and the flatness is maintained. Thus, the portion of the p$^+$ source region LPS that is not covered with the insulating film IL1a is flat. The end portion of the insulating film IL1a on the channel region PCH side is inclined upward from the channel region PCH toward the p$^{++}$ source region PS. As a result, the gate insulating film GI1a has a cross sectional form in which the film GI1a is flat from the channel region PCH to almost the center of the p$^+$ source region LPS in the channel length direction, and is inclined upward from almost the center toward the p$^{++}$ source region PS.

Similarly, since the impurity concentration of the p$^+$ drain region LPD is not so high, compared with the impurity concentration of the p$^{++}$ drain region PD, the crystallizability of the region LPD is not reduced, and the flatness is maintained. Thus, the portion of the p$^+$ drain region LPD that is not covered with the insulating film IL1b is flat. The end portion of the insulating film IL1b on the channel region PCH side is inclined upward from the channel region PCH toward the p$^{++}$ drain region PD. As a result, the gate insulating film GI1a has a cross sectional form in which the film GI1a is flat from the channel region PCH to almost the center of the p$^+$ drain region LPD in the channel length direction and is inclined upward from almost the center toward the p$^{++}$ drain region PD. As described above, the gate electrode GEa on the gate insulating film GI1a also has a similar cross sectional form. Unlike Case study example 1, this structure provides excellent contact of the p$^+$ source region LPS and the p$^+$ drain region LPD with the gate insulating film GI1a formed on the p$^+$ source region LPS and the p$^+$ drain region LPD and excellent contact of the gate insulating film GI1a with the gate electrode GEa, and hence electric field concentrations rarely occur. Unlike Case study example 2, the distortion of the gate electrode GEa is decreased, and hence electric field concentrations rarely occur in the regions.

Similarly, as shown in FIG. 1, since the impurity concentration of the $n^+$ source region LNS is not so high, compared with the impurity concentration of the $n^{++}$ source region NS, the crystallizability of the region LNS is not reduced, and the flatness is maintained. Thus, the portion of the $n^+$ source region LNS that is not covered with the insulating film IL1$c$ is flat. The end portion of the insulating film IL1$c$ on the channel region NCH side is inclined upward from the channel region NCH toward the $n^{++}$ source region NS. As a result, the gate insulating film GI1$b$ has a cross sectional form in which the film GI1$b$ is flat from the channel region NCH to almost the center of the $n^+$ source region LNS in the channel length direction and is inclined upward from almost the center toward the $n^{++}$ source region NS.

Similarly, since the impurity concentration of the $n^+$ drain region LND is not so high, compared with the impurity concentration of the $n^{++}$ drain region ND, the crystallizability of the region LND is not reduced, and the flatness is maintained. Thus, the portion of the $n^+$ drain region LND that is not covered with the insulating film IL1$d$ is flat. The end portion of the insulating film IL1$d$ on the channel region NCH side is inclined upward from the channel region NCH toward the $n^{++}$ drain region ND. As a result, the gate insulating film GI1$b$ has a cross sectional form in which the film GI1$b$ is flat from the channel region NCH to almost the center of the $n^+$ drain region LND in the channel length direction, and is inclined upward from almost the center toward the $n^{++}$ drain region ND. As described above, the gate electrode GEb on the gate insulating film GI1$b$ also has a similar cross sectional form. This structure provides excellent contact of the $n^+$ source region LNS and the $n^+$ drain region LND with the gate insulating film GI1$b$ formed on the $n^+$ source region LNS and the $n^+$ drain region LND, and excellent contact of the gate insulating film GI1$b$ with the gate electrode GEb, and hence electric field concentrations rarely occur. Unlike Case study example 2, the distortion of the gate electrode GEb is decreased, and hence electric field concentrations rarely occur in the regions.

Consequently, in the embodiment, the prevention of the occurrence of gate leakage currents is enabled while avoiding the process of light oxidation that needs high temperature processing.

As described above, in the embodiment, a reduction in leakage currents from the source region and the drain region to the gate electrode occurring in Case study examples 1 and 2 is enabled while avoiding the process of forming a metal silicide layer and the process of light oxidation, and hence the improvement of reliability of semiconductor devices is enabled.

As shown in FIG. 2, in the embodiment, when the under surface of the gate electrode GEa on the insulating film IL1$a$ side is separated into the first under surface S1 in parallel with the inclined surface at the end portion of the insulating film IL1$a$, the second under surface S2 in parallel with the top surface of the channel region PCH, and the third under surface S3 connecting the first under surface S1 to the second under surface S2, the third under surface S3 includes a curved surface, and a part of the curved surface of the third under surface S3 of the gate electrode GEa can be approximated to an arc. The curvature radius R1 of the arc is 1.8 times or more of the film thickness of the gate insulating film GI1$a$. Thus, distortion rarely occurs in the gate electrode GEa. Although not shown in the drawing, the same thing is applied to the under surface of the gate electrode GEa on the insulating film IL1$b$ side, the under surface of the gate electrode GEb on the insulating film IL1$c$ side, and the under surface of the gate electrode GEb on the insulating film IL1$d$ side. That is, the under surfaces of the gate electrodes GEa and GEb that are placed on the insulating films IL1$b$, IL1$c$, and IL1$d$ through the gate insulating films GI1$a$ and GI1$b$ include a curved surface. Thus, this structure enables more reliable relaxation of electric field concentrations occurring in the gate electrodes GEa and GEb.

As shown in FIG. 1, in the embodiment, the end portion of the insulating film IL1$a$ on the $p^{++}$ source region PS side, the end portion of the insulating film IL1$b$ on the $p^{++}$ drain region PD side, the end portion of the insulating film IL1$c$ on the $n^{++}$ source region NS side, and the end portion of the insulating film IL1$d$ on the $n^{++}$ drain region ND side each include an inclined surface. Thus, in depositing a metal film on the $p^{++}$ source region PS, the $p^{++}$ drain region PD, the $n^{++}$ source region NS, and the $n^{++}$ drain region ND to form electrodes, the metal film is easily deposited on the insulating films IL1$a$, IL1$b$, IL1$c$, and IL1$d$ each having the inclined surface. Thus, this structure provides excellent contact of the $p^{++}$ source region PS with the source wiring electrode M1$a$, excellent contact of the $p^{++}$ drain region PD with the drain wiring electrode M1$b$, excellent contact of the $n^{++}$ source region NS with the source wiring electrode M1$c$, and excellent contact of the $n^{++}$ drain region ND with the drain wiring electrode M1$d$.

Note that the $p^{++}$ source region PS and the $p^{++}$ drain region PD preferably include aluminum (Al) as a p-type impurity. Since aluminum (Al) has an atomic radius (an ionic radius) greater than the atomic radius of boron (B), Al deeply enters the $n^-$ epitaxial layer EP in which the $p^{++}$ source region PS and the $p^{++}$ drain region PD are formed, and hence Al enables the improvement of conductivity of the $p^{++}$ source region PS and the $p^{++}$ drain region PD.

The $n^{++}$ source region NS and the $n^{++}$ drain region ND preferably include both of nitrogen (N) and phosphorus (P) as n-type impurities. Since phosphorus (P) has an atomic radius (an ionic radius) greater than the atomic radius of nitrogen (N), P can deeply enter the $n^-$ epitaxial layer EP (the p well region PW) in which the $n^{++}$ source region NS and the $n^{++}$ drain region ND are formed. On the other hand, when nitrogen (N) is doped in the $n^-$ epitaxial layer EP (the p well region PW) made of silicon carbide, N can improve conductivity more than the case in which phosphorus (P) is similarly doped, because of the relationship between donor level positions in the band gap of silicon carbide. Therefore, both of nitrogen (N) and phosphorus (P) ions are implanted into the $n^{++}$ source region NS and the $n^{++}$ drain region ND, and hence this ion implantation enables the improvement of conductivity of the $n^{++}$ source region NS and the $n^{++}$ drain region ND.

The gate insulating films GI1$a$ and GI1$b$ according to the embodiment are described using an example in which the films GI1$a$ and GI1$b$ are formed as a film stack having the insulating film GO1, the insulating film GA formed on the insulating film GO1, and the insulating film GO2 formed on the insulating film GA. The gate insulating films GI1$a$ and GI1$b$ may be composed of the insulating film GA formed only of an aluminum oxide film. However, the films GI1$a$ and GI1$b$ are formed as a film stack having at least the insulating film GO1, and this structure provides merits below.

First, in the case in which the gate insulating films GI1$a$ and GI1$b$ are formed in a film stack structure, the film thicknesses of the gate insulating films GI1$a$ and GI1$b$ can be increased while a constant film thickness of the aluminum oxide film is maintained. Thus, a decrease in electric fields in the gate insulating films GI1a and GI1b is enabled, and a reduction in the occurrence of gate leakage currents is enabled.

Subsequently, in the case in which the gate insulating films GI1a and GI1b are formed in a film stack structure having the insulating films GO1 and GA, the interface between the gate insulating films GI1a and GI1b and the n⁻ epitaxial layer EP can be formed in an SiO₂/SiC structure. In the case in which the gate insulating films GI1a and GI1b are formed in a film stack structure having the insulating films GO1, Ga, and GO2, the interface between the gate electrodes GEa and GEb made of polysilicon and the gate insulating films GI1a and GI1b can be formed in an Si/SiO₂ structure. Thus, the number of defects, such as trap level, is reduced, and hence the improvement of reliability of semiconductor devices is enabled.

Note that as shown in FIG. 1, in the first embodiment, the insulating film GA formed of an aluminum oxide film is also introduced into the gate insulating film GI1b of the n-channel MOSFET. As described above, since the aluminum oxide film acts as negative fixed charges, introducing an aluminum oxide film into the gate insulating film of the n-channel MOSFET increases the absolute value of the threshold voltage of the n-channel MOSFET. However, as described above, in the n-channel MOSFET, since the contribution of fixed charges is originally great, a problem of increasing the absolute value of the threshold voltage of the n-channel MOSFET can be solved by design change, such as optimization of the impurity concentration of the channel region NCH, for example, i.e. the p well region PW.

First Exemplary Modification

Figure 20:
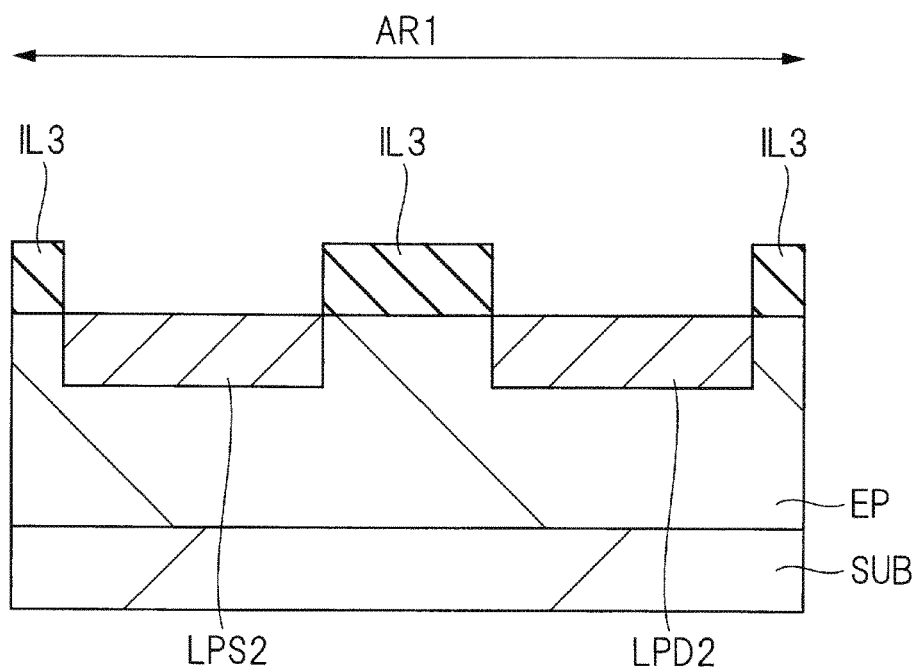
FIG. 20 is a cross sectional view of the main components in the fabrication processes of a semiconductor device of a first exemplary modification.
Figure 21:
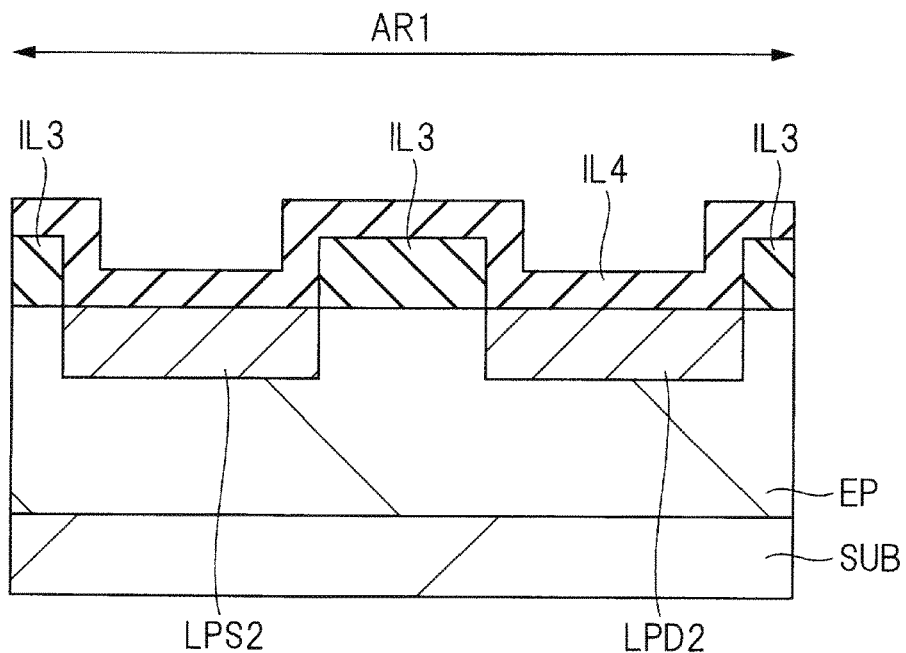
FIG. 21 is a cross sectional view of the main components in the fabrication processes of the semiconductor device subsequent to FIG. 20.
Figure 22:
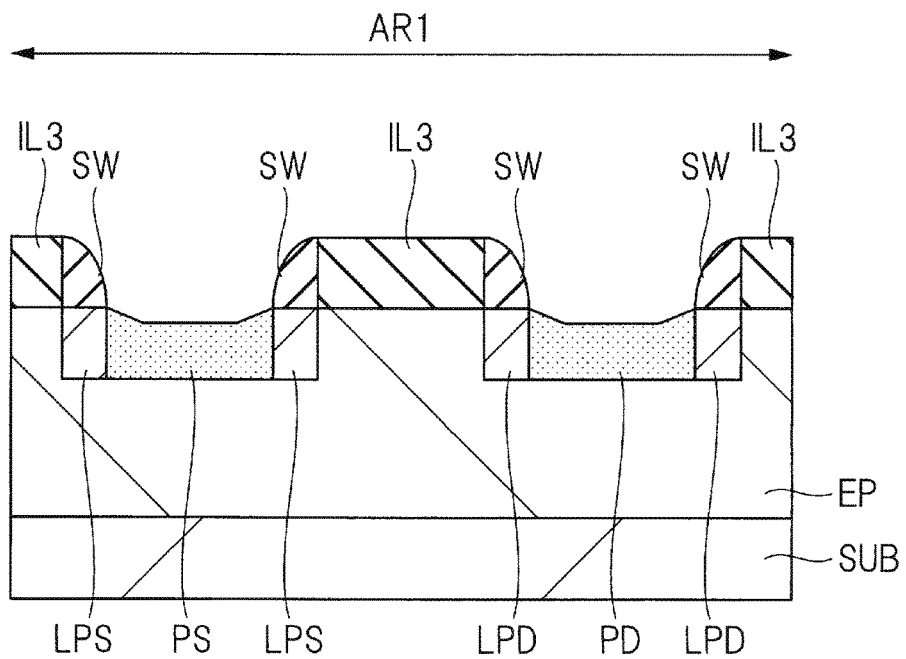
FIG. 22 is a cross sectional view of the main components in the fabrication processes of the semiconductor device subsequent to FIG. 21.

The fabrication processes of a semiconductor device according to a first exemplary modification of the first embodiment will be described with reference to FIGS. 20 to 22. FIGS. 20 to 22 are cross sectional views of the main components in the fabrication processes of the semiconductor device according to the first exemplary modification. The structure of the semiconductor device according to the first exemplary modification is the same as the structure of the semiconductor device according to the first embodiment. In FIGS. 20 to 22, in the regions corresponding to FIG. 1, only the structure of a p-channel MOSFET formed in the region AR1 is shown, the structure of an n-channel MOSFET formed in the region AR2 is omitted for simplifying the description.

The semiconductor device of Case study example 1 shown in FIG. 18 has the n⁺ SiC substrate SUB, the n⁻ epitaxial layer EP formed on the n⁺ SiC substrate SUB, and the p⁺⁺ source region PS and the p⁺⁺ drain region PD formed in the n⁻ epitaxial layer EP, similar to the semiconductor device according to the embodiment. That is, the p⁺⁺ source region PS and the p⁺⁺ drain region PD are doped with an impurity at a concentration of $5 \times 10^{20}$ cm⁻³ to $5 \times 10^{21}$ cm⁻³ are.

In the case of the first exemplary modification, the fabrication processes are almost the same as the fabrication processes of the semiconductor device according to the first embodiment until the structure corresponding to FIG. 4 is obtained. In the case of the first exemplary modification, after the structure corresponding to FIG. 4 is obtained, as shown in FIG. 20, on the n⁻ epitaxial layer EP, an insulating film IL3 made of silicon oxide, for example, is formed, and patterned by dry etching, for example. After that, the patterned insulating film IL3 is used as a mask (an ion implantation blocking mask), p-type impurity ions, boron (B) ions or aluminum (Al) ions, for example, are implanted into the n⁻ epitaxial layer EP, and then a p⁺ source region LPS2 and a p⁺ drain region LPD2 are formed in the region AR1. The p⁺ source region LPS2 is a region in which the p⁺⁺ source region PS and the p⁺ source region LPS are formed by processes described later. The p⁺ drain region LPD2 is a region in which the p⁺⁺ drain region PD and the p⁺ drain region LPD are formed by processes described later.

Subsequently, as shown in FIG. 21, on the n⁻ epitaxial layer EP, an insulating film IL4 made of silicon oxide, for example, is formed. After that, the insulating film IL4 is etched by anisotropic dry etching, for example. As shown in FIG. 22, a sidewall SW formed of the insulating film IL4 is formed on both sides of the patterned insulating film IL3.

Subsequently, the patterned insulating film IL3 and the sidewall SW are used as a mask, p-type impurity ions, boron (B) ions or aluminum (Al) ions, for example, are implanted into a part of the p⁺ source region LPS2 and a part of the p⁺ drain region LPD2 shown in FIG. 21. As shown in FIG. 22, the p⁺⁺ source region PS and the p⁺⁺ drain region PD are formed in the region AR1. Note that in the p⁺ source region LPS2 and the p⁺ drain region LPD2 shown in FIG. 21, the regions covered with the sidewall SW where no p-type impurity ions are implanted are the p⁺ source region LPS and the p⁺ drain region LPD as shown in FIG. 22. After that, the insulating film IL3 and the sidewall SW are removed. The subsequent processes are almost similar to the fabrication processes of the first embodiment corresponding to the processes after FIG. 7.

In the fabrication processes of the semiconductor device according to the first exemplary modification shown in FIGS. 20 to 22, the p⁺⁺ source region PS, the p⁺ source region LPS, the p⁺⁺ drain region PD, and the p⁺ drain region LPD are formed by self alignment using a hard mask formed of an insulating film, not a photoresist pattern. Thus, the regions PS, LPS, PD, and LPD can be formed by self alignment with a reduced use of photolithography processes. Thus, the first exemplary modification is more advantageous than the first embodiment at a point that can prevent a problem due to the positional displacement of the photoresist pattern.

Note that as shown in FIG. 22, in the first exemplary modification, the p⁺ source region LPS is formed on both sides of the p⁺⁺ source region PS, and the p⁺ drain region LPD is formed on both sides of the p⁺⁺ drain region PD in the channel length direction. This structure corresponds to the case in which the p-channel and the n-channel MOSFETs are alternately formed on the SiC substrate. As shown in FIG. 22, the first exemplary modification is advantageous in the case in which such a semiconductor device is fabricated because of the process of forming the sidewall SW. On the other hand, in the case in which the p-channel MOSFET is formed alone, for example, the first embodiment is advantageous because of a high degree of freedom of fabrication processes.

Second Exemplary Modification

Figure 23:
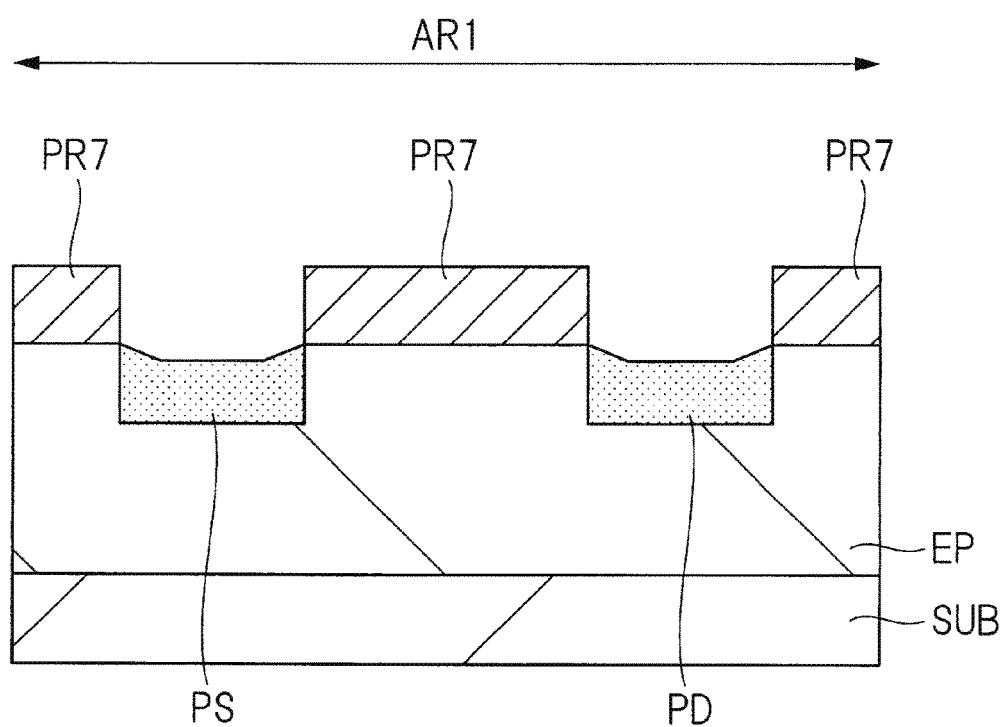
FIG. 23 is a cross sectional view of the main components in the fabrication processes of a semiconductor device of a second exemplary modification.
Figure 24:
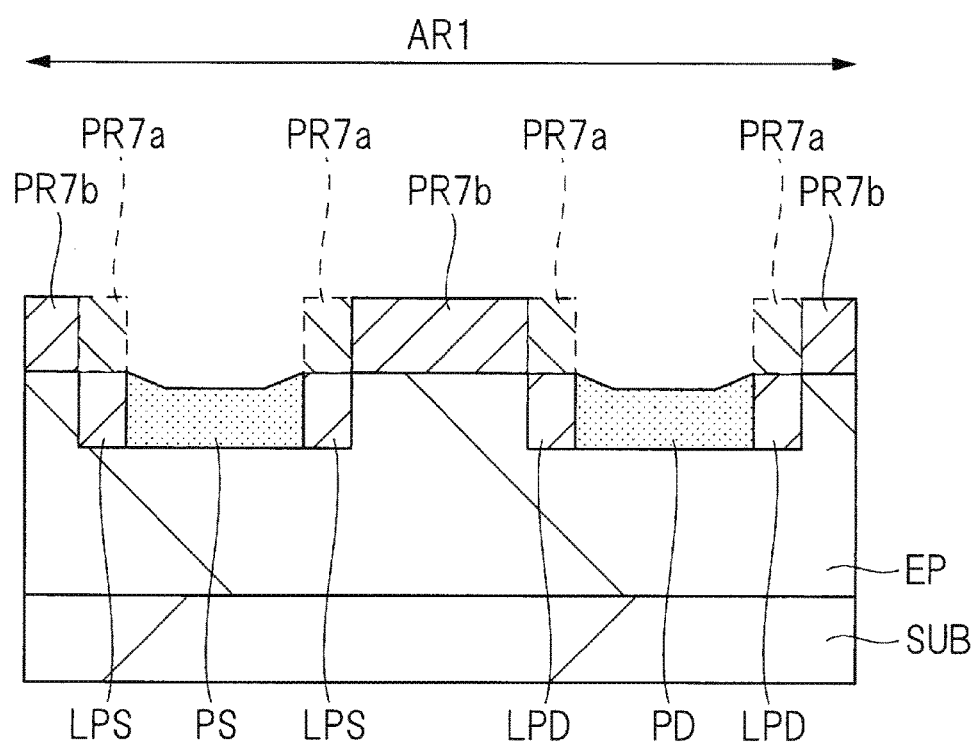
FIG. 24 is a cross sectional view of the main components in the fabrication processes of the semiconductor device subsequent to FIG. 23.

The fabrication processes of a semiconductor device according to a second exemplary modification of the first embodiment will be described with reference to FIGS. 23 and 24. FIGS. 23 and 24 are cross sectional views of the main components in the fabrication processes of the semiconductor device according to the second exemplary modification. The structure of the semiconductor device according to the second exemplary modification is the same as the structures of the semiconductor devices according to the first embodiment and the first exemplary modification. In FIGS. 23 and 24, in the regions corresponding to FIG. 1, only the structure of a p-channel MOSFET formed in the region AR1 is shown, and the structure of an n-channel MOSFET formed in the region AR2 is omitted for simplifying the description.

In the case of the second exemplary modification, the fabrication processes are almost the same as the fabrication processes of the semiconductor device according to the first embodiment until the structure corresponding to FIG. 4 is obtained. In the case of the second exemplary modification, after the structure in FIG. 4 is obtained, as shown in FIG. 23, a photoresist pattern PR7 formed by photolithography techniques is used as a mask, p-type impurity ions, boron (B) ions or aluminum (Al) ions, for example, are implanted into the $n^-$ epitaxial layer EP, and then the $p^{++}$ source region PS and the $p^{++}$ drain region PD are formed in the region AR1.

Subsequently, as shown in FIG. 24, the photoresist pattern PR7 is slimmed. Examples of slimming methods include a method of ashing the photoresist pattern PR7 for a short time using oxygen plasma and a method of isotropically polishing the photoresist pattern PR7 with argon (Ar) ions. Slimming the photoresist pattern PR7 removes a photoresist pattern PR7a that is a part of the photoresist pattern PR7, and a photoresist pattern PR7b is left.

Subsequently, as shown in FIG. 24, the photoresist pattern PR7b is used as a mask, p-type impurity ions, boron (B) ions or aluminum (Al) ions, for example, are implanted into the $n^-$ epitaxial layer EP, and then the $p^+$ source region LPS and the $p^+$ drain region LPD are formed in the region AR1. After that, the photoresist pattern PR7b is removed. The subsequent processes are almost similar to the fabrication processes of the first embodiment corresponding to the processes after FIG. 7.

In the fabrication processes of the semiconductor device according to the second exemplary modification shown in FIGS. 23 and 24, the $p^{++}$ source region PS, the $p^+$ source region LPS, the $p^{++}$ drain region PD, and the $p^+$ drain region LPD are formed by slimming the photoresist pattern. Thus, similarly to the first exemplary modification, the regions PS, LPS, PD, and LPD can be formed by self alignment with a reduced use of photolithography processes. Thus, the second exemplary modification is more advantageous than the first embodiment at a point that can prevent a problem due to the positional displacement of the photoresist pattern.

Note that as shown in FIG. 24, in the second exemplary modification, the $p^+$ source region LPS is formed on both sides of the $p^{++}$ source region PS, and the $p^+$ drain region LPD is formed on both sides of the $p^{++}$ drain region PD in the channel length direction. This structure corresponds to the case in which the p-channel and the n-channel MOSFETs are alternately formed on the SiC substrate. As shown in FIG. 24, the second exemplary modification is advantageous in the case in which such a semiconductor device is fabricated because of the process of slimming the photoresist pattern. On the other hand, in the case in which the p-channel MOSFET is formed alone, for example, the first embodiment is advantageous because of a high degree of freedom of fabrication processes.

Note that as shown in FIG. 24, in the second exemplary modification, p-type impurity ions are further implanted into the $p^{++}$ source region PS and the $p^{++}$ drain region PD that are already formed. However, since the impurity concentrations of the $p^{++}$ source region PS and the $p^{++}$ drain region PD are as high as $5\times10^{20}$ cm$^{-3}$ or more, no problem arises when p-type impurity ions are implanted later at a low concentration of $1\times10^{20}$ cm$^{-3}$ or less. In order to improve the controllability of the impurity concentrations of the $p^{++}$ source region PS and the $p^{++}$ drain region PD, the total concentration of impurity ions implanted into the $p^{++}$ source region PS and the $p^{++}$ drain region PD may be controlled to $5\times10^{20}$ cm$^{-3}$ or more.

Second Embodiment

Figure 25:
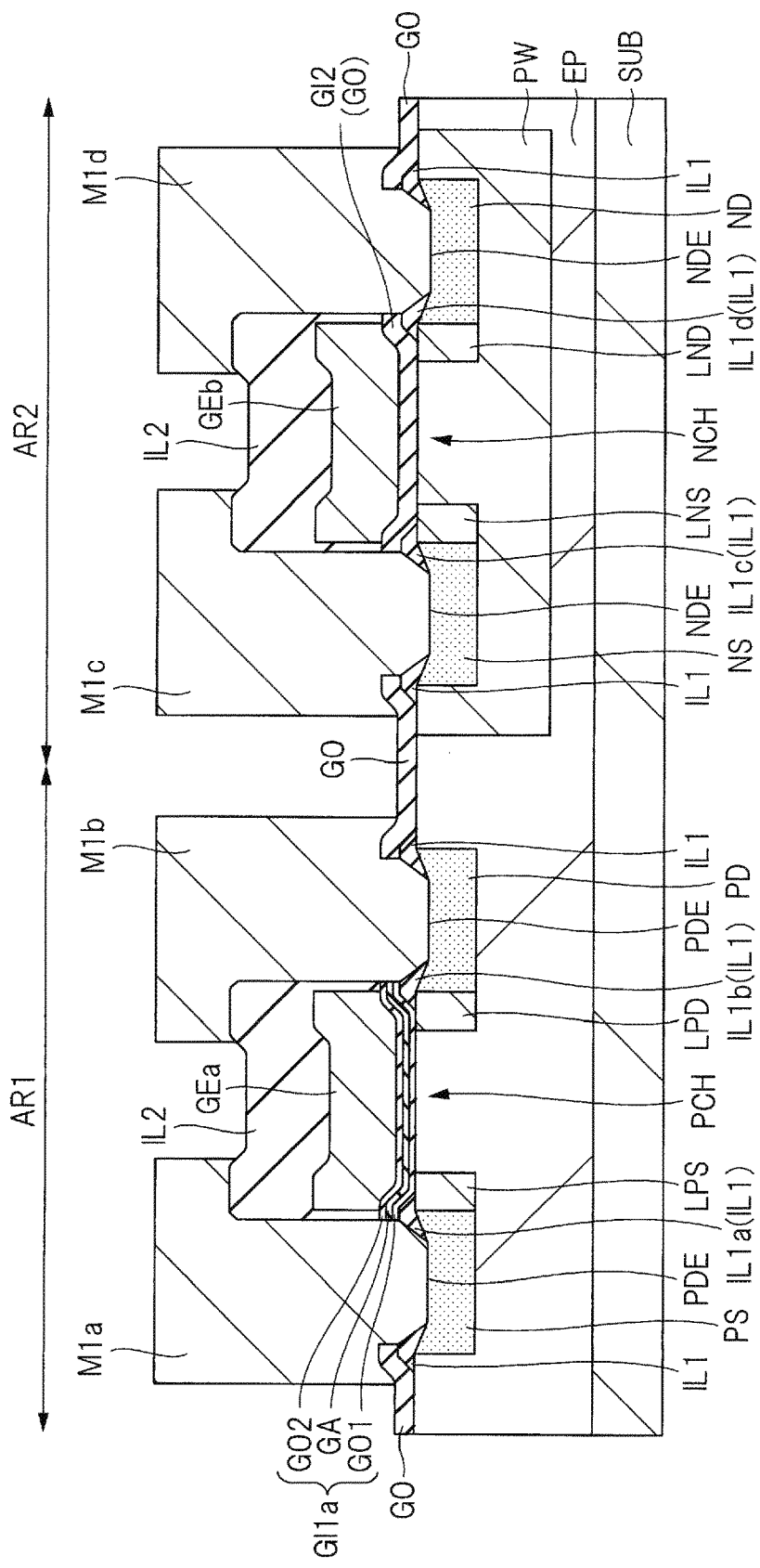
FIG. 25 is a cross sectional view of the main components of a semiconductor device according to a second embodiment.

A semiconductor device according to a second embodiment will be described with reference to FIG. 25. FIG. 25 is a cross sectional view of the main components of the semiconductor device according to the second embodiment.

As shown in FIG. 25, in the semiconductor device according to the second embodiment, the structures other than the structure of a gate insulating film GI2 of an n-channel MOSFET formed in the region AR2 are similar to the semiconductor device according to the first embodiment, and the repeated description is omitted here.

As shown in FIG. 25, the semiconductor device according to the second embodiment is similar to the first embodiment in that a gate insulating film GI1a of a p-channel MOSFET formed in the region AR1 is formed of a film stack having an insulating film GO1 formed of a silicon oxide film, an insulating film GA formed of an aluminum oxide film, and an insulating film GO2 formed of a silicon oxide film. However, the semiconductor device according to the second embodiment is different from the first embodiment in that the gate insulating film GI2 of the n-channel MOSFET (a second gate insulating film) formed in the region AR2 includes only an insulating film GO and does not include the insulating film GA formed of an aluminum oxide film.

The insulating film GO is composed of a silicon oxide film, for example. The film thickness of the gate insulating film GI2, i.e. the film thickness of the insulating film GO preferably ranges from 10 to 50 nm, and the film thickness is more preferably the same as the film thickness of the gate insulating film GI1a of the p-channel MOSFET.

Note that as shown in FIG. 25, on an $n^-$ epitaxial layer EP where the p-channel and the n-channel MOSFETs are not formed (partially including the surfaces on a $p^{++}$ source region PS, a $p^{++}$ drain region PD, a p well region PW, an $n^{++}$ source region NS, and an $n^{++}$ drain region ND), an insulating film IL1 and the insulating film GO are left as field insulating films as an example.

As described above, since the aluminum oxide film acts as negative fixed charges, introducing an aluminum oxide film into the gate insulating film of the p-channel MOSFET enables a reduction in the absolute value of the threshold voltage of the p-channel MOSFET. However, introducing an aluminum oxide film into the gate insulating film of the n-channel MOSFET increases the absolute value of the threshold voltage of the n-channel MOSFET. Thus, in the second embodiment, introducing the aluminum oxide film only into the gate insulating film GI1a of the p-channel MOSFET enables a reduction in the absolute value of the threshold voltage of the p-channel MOSFET with no increase in the absolute value of the threshold voltage of the n-channel MOSFET. With this structure, the second embodiment is advantageous compared with the first embodiment in that the second embodiment easily provides the same absolute values of the threshold voltages of the p-channel and the n-channel MOSFETs and the second embodiment enables the improvement of the degree of freedom of design of semiconductor devices.

Note that in the second embodiment, the gate insulating film GI1a of the p-channel MOSFET and the gate insulating film GI2 of the n-channel MOSFET have to be formed by different processes (e.g. in FIG. 14, the insulating film GA is formed only in the region AR1 with the region AR2 masked). This increases the number of fabrication processes more than in the first embodiment. Thus, the first embodiment is advantageous more than the second embodiment because of manufacturing costs.

Third Embodiment

Figure 26:
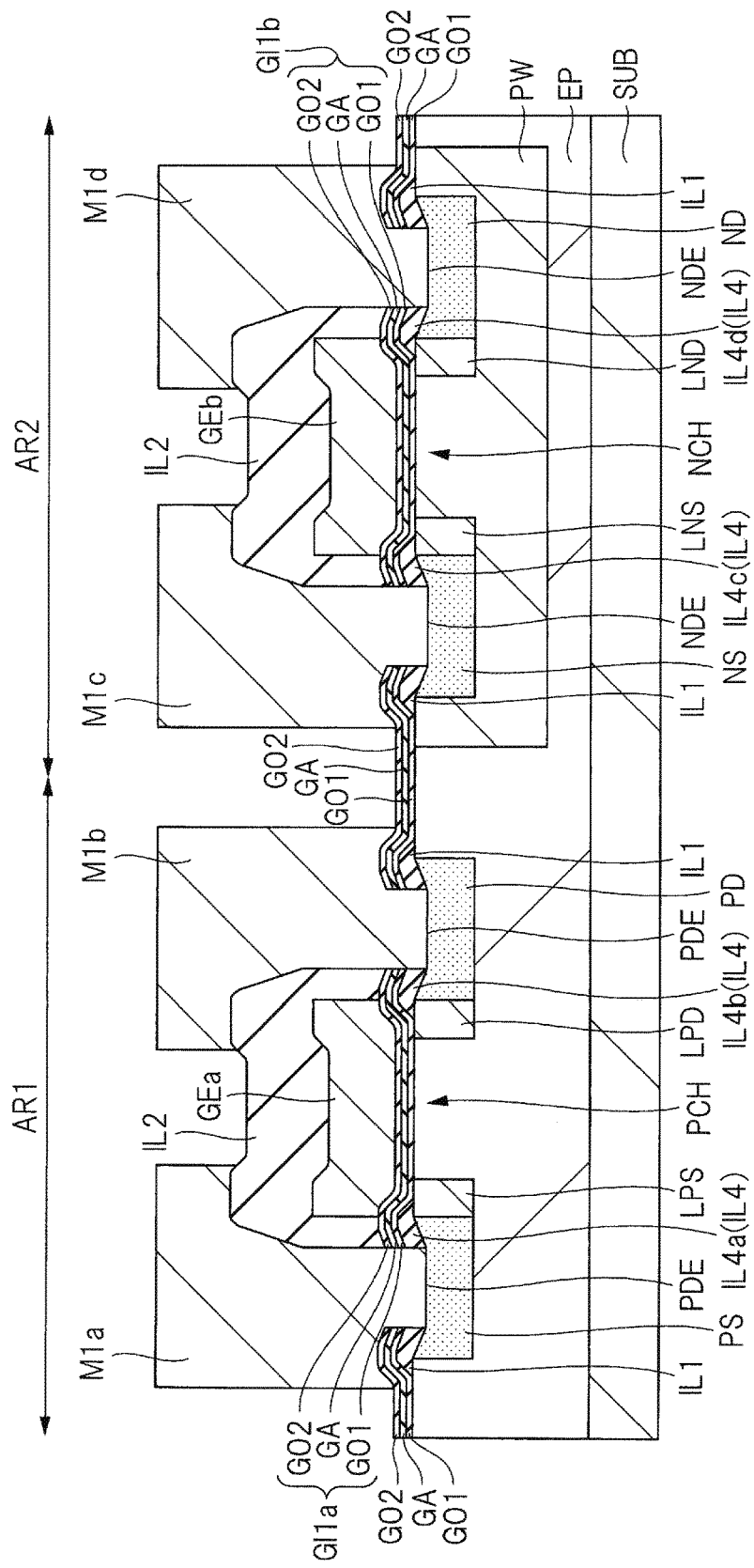
FIG. 26 is a cross sectional view of the main components of a semiconductor device according to a third embodiment.

A semiconductor device according to a third embodiment will be described with reference to FIG. 26. FIG. 26 is a cross sectional view of the main components of the semiconductor device according to the third embodiment.

As shown in FIG. 26, in the semiconductor device according to the third embodiment, the structures other than the structures of insulating films IL4a, IL4b, IL4c, and IL4d and the shapes of the insulating films formed on these insulating films are the same as the semiconductor device according to the first embodiment, and the repeated description is omitted here.

The third embodiment is different from the first embodiment in that the end portion of the insulating film IL4a on the $p^{++}$ source region PS side, the end portion of the insulating film IL4b on the $p^{++}$ drain region PD side, the end portion of the insulating film IL4c on the $n^{++}$ source region NS side, and the end portion of the insulating film IL4d on the $n^{++}$ drain region ND side have vertical surfaces, not inclined surfaces.

In the case of the third embodiment, the fabrication processes are almost the same as the fabrication processes of the semiconductor device according to the first embodiment until the structure corresponding to FIG. 16 is obtained. In the third embodiment, after the structure corresponding to FIG. 16 is obtained, an insulating film IL4 is vertically etched similarly to insulating films IL2, GO1, Ga, and GO2, and hence the end portions of the insulating films IL4a, IL4b, IL4c, and IL4d can be provided with vertical surfaces flush with the end portions of the insulating films IL2, GO1, Ga, and GO2. The subsequent processes are almost similar to the fabrication processes of the first embodiment corresponding to the processes after FIG. 17.

Note that in FIG. 26, the end portions of the insulating films IL4a, IL4b, IL4c, and IL4d are aligned with recesses PDE and NDE, which is non-limiting. A $p^{++}$ source region PS, a $p^{++}$ drain region PD, a $n^{++}$ source region NS, and a $n^{++}$ drain region ND only have to be exposed.

As described above, in the third embodiment, the end portions of the insulating films IL4a, IL4b, IL4c, and IL4d are vertical surfaces flush with the end portions of the insulating films IL2, GO1, Ga, and GO2, and hence this structure enables easy optimization of the etching conditions. From this viewpoint, the third embodiment is more advantageous than the first embodiment. However, when the end portions of the insulating films IL4a, IL4b, IL4c, and IL4d are vertical surfaces flush with the end portions of the insulating films IL2, GO1, Ga, and GO2, a metal film might not be easily deposited in depositing the metal film on the $p^{++}$ source region PS, the $p^{++}$ drain region PD, the $n^{++}$ source region NS, and the $n^{++}$ drain region ND to form electrodes. Thus, the first embodiment is more advantageous than the third embodiment in that the first embodiment provides excellent contact of the $p^{++}$ source region PS with the source wiring electrode M1a, excellent contact of the $p^{++}$ drain region PD with the drain wiring electrode M1b, excellent contact of the $n^{++}$ source region NS with the source wiring electrode M1c, and excellent contact of the $n^{++}$ drain region ND with the drain wiring electrode M1d.

As described above, the invention made by the present inventors is specifically described based on the embodiments. However, it is without saying that the present invention is not limited to the embodiments and the present invention can be variously modified and altered within the scope not deviating from the gist of the present invention.

What is claimed is:

1. A semiconductor device comprising:

a substrate of a first conductive type, the substrate being made of silicon carbide;

an epitaxial layer of the first conductive type formed on a principal surface of the substrate, the epitaxial layer being made of silicon carbide;

a first source region formed apart from a first drain region in the epitaxial layer, the first source region and the first drain region being of a second conductive type different from the first conductive type;

a first low concentration source region of the second conductive type formed in the epitaxial layer, the first low concentration source region being adjacent to the first source region on a side where the first drain region is disposed;

a first low concentration drain region of the second conductive type formed in the epitaxial layer, the first low concentration drain region being adjacent to the first drain region on a side where the first source region is disposed;

a first channel region formed at a surface layer portion of the epitaxial layer between an end side surface of the first low concentration source region and an end side surface of the first low concentration drain region;

a first insulating film formed on the first source region and the first low concentration source region;

a second insulating film formed on the first drain region and the first low concentration drain region;

a first gate insulating film formed on the first channel region, the first low concentration source region, the first low concentration drain region, the first insulating film, and the second insulating film;

a first gate electrode formed on the first gate insulating film; and a third insulating film formed so as to cover the first gate electrode, wherein the first gate insulating film includes an aluminum oxide film;

an impurity concentration of the first source region and an impurity concentration of the first drain region are $5 \times 10^{20}$ cm$^{-3}$ or more;

an impurity concentration of the first low concentration source region and an impurity concentration of the first low concentration drain region are $1 \times 10^{20}$ cm$^{-3}$ or less;

an end portion of the first insulating film on a side where the first channel region is disposed is disposed on the first low concentration source region, and the end portion of the first insulating film has a first inclined surface where a thickness of the first insulating film is reduced along a direction from the first low concentration source region toward the first channel region;

an end portion of the second insulating film on the side where the first channel region is disposed is disposed on the first low concentration drain region, and the end portion of the second insulating film has a second inclined surface where a thickness of the second insulating film is reduced along a direction from the first low concentration drain region toward the first channel region; and the first gate electrode is disposed, through the first gate insulating film, on the first channel region, the first low concentration source region, the first low concentration drain region, the first inclined surface of the first insulating film, and the second inclined surface of the second insulating film.

2. The semiconductor device according to claim 1, further comprising:
a well region of the second conductive type formed in the epitaxial layer;
a second source region of the first conductive type and a second drain region of the first conductive type, the second source region and the second drain region being apart from an end side surface of the well region, the second source region being formed apart from the second drain region in the well region;
a second low concentration source region of the first conductive type formed in the well region adjacent to the second source region on a side where the second drain region is disposed;
a second low concentration drain region of the first conductive type formed in the well region adjacent to the second drain region on a side where the second source region is disposed;
a second channel region formed at a surface layer portion of the well region between an end side surface of the second low concentration source region and an end side surface of the second low concentration drain region;
a fourth insulating film formed on the second source region and the second low concentration source region;
a fifth insulating film formed on the second drain region and the second low concentration drain region;
a second gate insulating film formed on the second channel region, the first insulating film, and the second insulating film;
a second gate electrode formed on the second gate insulating film; and
a sixth insulating film formed so as to cover the second gate electrode,
wherein an impurity concentration of the second source region and an impurity concentration of the second drain region are $5 \times 10^{20}$ cm$^{-3}$ or more;
an impurity concentration of the second low concentration source region and an impurity concentration of the second low concentration drain region are $1 \times 10^{20}$ cm$^{-3}$ or less;
an end portion of the fourth insulating film on a side where the second channel region is disposed is disposed on the second low concentration source region, and the end portion has a third inclined surface where a thickness of the fourth insulating film is reduced along a direction from the second low concentration source region toward the second channel region;
an end portion of the fifth insulating film on the side where the second channel region is disposed is disposed on the second low concentration drain region, and the end portion has a fourth inclined surface where a thickness of the fifth insulating film is reduced along a direction from the second low concentration drain region toward the second channel region; and
the second gate electrode is disposed, through the second gate insulating film, on the second channel region, the second low concentration source region, the second low concentration drain region, the third inclined surface of the fourth insulating film, and the fourth inclined surface of the fifth insulating film.

3. The semiconductor device according to claim 1, wherein a surface of the first source region and a surface of the first drain region are more recessed than a surface of the first channel region.

4. The semiconductor device according to claim 2, wherein a surface of the second source region and a surface of the second drain region are more recessed than a surface of the second channel region.

5. The semiconductor device according to claim 1, wherein the first gate insulating film is formed of a film stack having a silicon oxide film, an aluminum oxide film formed on the silicon oxide film, and a silicon oxide film formed on the aluminum oxide film.

6. The semiconductor device according to claim 2, wherein the second gate insulating film is formed of a silicon oxide film.

7. The semiconductor device according to claim 1,
wherein a first top surface of the first gate insulating film formed on the first inclined surface of the first insulating film is connected to a second top surface of the first gate insulating film formed on the first channel region through a third top surface of the first gate insulating film;
a fourth top surface of the first gate insulating film formed on the second inclined surface of the second insulating film is connected to the second top surface of the first gate insulating film formed on the first channel region through a fifth top surface of the first gate insulating film; and
the third top surface and the fifth top surface include a curved surface.

8. The semiconductor device according to claim 7,
wherein an angle formed by the first top surface of the first gate insulating film and the second top surface of the first gate insulating film is 45° or more and less than 90°; and
an angle formed by the fourth top surface of the first gate insulating film and the second top surface of the first gate insulating film is 45° or more and less than 90°.

9. The semiconductor device according to claim 2,
wherein a first top surface of the second gate insulating film formed on the third inclined surface of the fourth insulating film is connected to a second top surface of the second gate insulating film formed on the second channel region through a third top surface of the second gate insulating film;
a fourth top surface of the second gate insulating film formed on the fourth inclined surface of the fifth insulating film is connected to the second top surface of the second gate insulating film formed on the second channel region through a fifth top surface of the second gate insulating film; and
the third top surface and the fifth top surface include a curved surface.

10. The semiconductor device according to claim 9,
wherein an angle formed by the first top surface of the second gate insulating film and the second top surface of the second gate insulating film is 45° or more and less than 90°; and
an angle formed by the fourth top surface of the second gate insulating film and the second top surface of the second gate insulating film is 45° or more and less than 90°.

11. The semiconductor device according to claim 2,
wherein an end portion of the first insulating film on the side where the first source region is disposed has a fifth inclined surface where the thickness of the first insulating film is reduced along a direction from the first low concentration source region toward the first source region;
an end portion of the second insulating film on the side where the first drain region is disposed has a sixth inclined surface where the thickness of the second insulating film is reduced along a direction from the first low concentration drain region toward the first drain region;

the end portion of the fourth insulating film on the side where the second source region is disposed has a seventh inclined surface where the thickness of the fourth insulating film is reduced along a direction from the second low concentration source region toward the second source region; and an end portion of the fifth insulating film on the side where the second drain region is disposed has an eighth inclined surface where the thickness of the fifth insulating film is reduced along a direction from the second low concentration drain region toward the second drain region.

12. A method of manufacturing a semiconductor device comprising the steps of:

(a) preparing a substrate of a first conductive type including silicon carbide;

(b) forming, on the substrate, an epitaxial layer of the first conductive type including silicon carbide;

(c) forming, in the epitaxial layer, a well region of a second conductive type different from the first conductive type;

(d) forming, in the epitaxial layer, a first source region of the second conductive type and a first drain region of the second conductive type apart from each other, forming, in the epitaxial layer, a first low concentration source region of the second conductive type adjacent to the first source region on a side where the first drain region is disposed, and forming, in the epitaxial layer, a first low concentration drain region of the second conductive type adjacent to the first drain region on a side where the first source region is disposed;

(e) forming, in the well region, a second source region of the first conductive type and a second drain region of the first conductive type apart from each other, the second source region and the second drain region being apart from an end side surface of the well region, forming, in the well region, a second low concentration source region of the first conductive type adjacent to the second source region on a side where the second drain region is disposed, and forming, in the well region, a second low concentration drain region of the first conductive type adjacent to the second drain region on a side where the second source region is disposed;

(f) forming a first insulating film on the epitaxial layer;

(g) patterning the first insulating film by isotropically etching the first insulating film to expose a first channel region formed at a surface layer portion of the epitaxial layer between an end side surface of the first low concentration source region and an end side surface of the first low concentration drain region and expose a second channel region formed at a surface layer portion of the well region between an end side surface of the second low concentration source region and an end side surface of the second low concentration drain region;

(h) forming a second insulating film including an aluminum oxide film on the epitaxial layer and the first insulating film patterned by the step (g);

(i) forming a semiconductor film on the second insulating film after the step (h);

(j) after the step (i), patterning the semiconductor film to form a first gate electrode and a second gate electrode;

(k) after the step (j), forming a third insulating film on the second insulating film, the first gate electrode, and the second gate electrode;

(l) patterning the second insulating film to form a first gate insulating film on the first channel region, the first low concentration source region, the first low concentration drain region, and the first insulating film and form a second gate insulating film on the second channel region, the second low concentration source region, the second low concentration drain region, and the first insulating film; and (m) further patterning the first insulating film patterned by the step (g) to leave the first insulating film on the first source region, the first low concentration source region, the first drain region, the first low concentration drain region, the second source region, the second low concentration source region, the second drain region, and the second low concentration drain region, wherein an impurity concentration of the first source region and an impurity concentration of the first drain region are $5 \times 10^{20}$ cm$^{-3}$ or more;

an impurity concentration of the second source region and an impurity concentration of the second drain region are $5 \times 10^{20}$ cm$^{-3}$ or more;

an impurity concentration of the first low concentration source region and an impurity concentration of the first low concentration drain region are $1 \times 10^{20}$ cm$^{-3}$ or less;

an impurity concentration of the second low concentration source region and an impurity concentration of the second low concentration drain region are $1 \times 10^{20}$ cm$^{-3}$ or less;

an end portion of the first insulating film on a side where the first channel region is disposed on the first source region and the first low concentration source region has a first inclined surface where a thickness of the first insulating film is reduced along a direction from the first low concentration source region toward the first channel region;

an end portion of the first insulating film on a side where the first channel region is disposed on the first drain region and the first low concentration drain region has a second inclined surface where the thickness of the first insulating film is reduced along a direction from the first low concentration drain region toward the first channel region;

the first gate electrode is disposed, through the first gate insulating film, on the first channel region, the first low concentration source region, the first low concentration drain region, the first inclined surface of the first insulating film, and the second inclined surface of the first insulating film;

an end portion of the first insulating film on a side where the second channel region is disposed on the second source region and the second low concentration source region is disposed on the second low concentration source region, and the end portion has a third inclined surface where the thickness of the first insulating film is reduced along a direction from the second low concentration source region toward the second channel region;

an end portion of the first insulating film on the side where the second channel region is disposed on the second drain region and the second low concentration drain region is disposed on the second low concentration drain region, and the end portion has a fourth inclined surface where the thickness of the first insulating film is reduced along a direction from the second low concentration drain region toward the second channel region; and the second gate electrode is disposed, through the second gate insulating film, on the second channel region, the second low concentration source region, the second low concentration drain region, the third inclined surface of the first insulating film, and the fourth inclined surface of the first insulating film.

13. The method of manufacturing a semiconductor device according to claim 12,
wherein the step (d) includes:
  (d1) forming a first impurity region by ion implantation of an impurity of the second conductive type from a surface of the epitaxial layer into the epitaxial layer using a first mask, and
  (d2) forming the first source region and the first drain region by ion implantation of an impurity of the second conductive type from the surface of the epitaxial layer into the first impurity region using a second mask; and
the step (e) includes:
  (e1) forming a second impurity region by ion implantation of an impurity of the first conductive type from the surface of the epitaxial layer into the well region using a third mask; and
  (e2) forming the second source region and the second drain region by ion implantation of an impurity of the first conductive type from the surface of the epitaxial layer into the second impurity region using a fourth mask;
the first low concentration source region and the first low concentration drain region are formed from the first impurity region where the impurity of the second conductive type is not doped by the ion implantation in the step (d2); and
the second low concentration source region and the second low concentration drain region are formed from the second impurity region where the impurity of the first conductive type is not doped by the ion implantation in the step (e2).

14. The method of manufacturing a semiconductor device according to claim 12,
wherein the step (d) includes:
  (d1) forming a first impurity region by ion implantation of an impurity of the second conductive type from a surface of the epitaxial layer into the epitaxial layer using a first mask,
  (d2) forming a third insulating film on the first mask and the first impurity region,
  (d3) anisotropically etching the third insulating film to form a first sidewall on a side surface of the first mask, and
  (d4) forming the first source region and the first drain region by ion implantation of an impurity of the second conductive type from the surface of the epitaxial layer into the first impurity region using the first mask and the first sidewall;
the step (e) includes:
  (e1) forming a second impurity region by ion implantation of an impurity of the first conductive type from the surface of the epitaxial layer into the well region using a second mask,
  (e2) forming a fourth insulating film on the second mask and the second impurity region,
  (e3) anisotropically etching the fourth insulating film to form a second sidewall on a side surface of the second mask, and
  (e4) forming the second source region and the second drain region by ion implantation of an impurity of the first conductive type from the surface of the epitaxial layer into the second impurity region using the second mask and the second sidewall;
the first low concentration source region and the first low concentration drain region are formed from the first impurity region where the impurity of the second conductive type is not doped by the ion implantation in the step (d4); and
the second low concentration source region and the second low concentration drain region are formed from the second impurity region where the impurity of the first conductive type is not doped by the ion implantation in the step (e4).

15. The method of manufacturing a semiconductor device according to claim 12,
wherein the step (d) includes:
  (d1) forming the first source region and the first drain region by ion implantation of an impurity of the second conductive type from a surface of the epitaxial layer into the epitaxial layer using a first mask,
  (d2) forming a second mask by slimming the first mask,
  (d3) forming the first low concentration source region and the first low concentration drain region by ion implantation of an impurity of the second conductive type from a surface of the epitaxial layer into the epitaxial layer using the second mask; and
the step (e) includes:
  (e1) forming the second source region and the second drain region by ion implantation of an impurity of the first conductive type from the surface of the epitaxial layer into the well region using a third mask,
  (e2) forming a fourth mask by slimming the third mask, and
  (e3) forming the second low concentration source region and the second low concentration drain region by ion implantation of an impurity of the first conductive type from the surface of the epitaxial layer into the well region using the fourth mask.

* * * * *